US010210890B2

(12) United States Patent
Fujimura

(10) Patent No.: US 10,210,890 B2
(45) Date of Patent: Feb. 19, 2019

(54) WIRED CIRCUIT BOARD AND PRODUCING METHOD THEREOF

(71) Applicant: NITTO DENKO CORPORATION, Osaka (JP)

(72) Inventor: Yoshito Fujimura, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 168 days.

(21) Appl. No.: 15/058,509

(22) Filed: Mar. 2, 2016

(65) Prior Publication Data

US 2016/0295694 A1    Oct. 6, 2016

(30) Foreign Application Priority Data

Mar. 30, 2015 (JP) ................................. 2015-070165

(51) Int. Cl.
*H05K 3/02* (2006.01)
*G11B 5/48* (2006.01)
(Continued)

(52) U.S. Cl.
CPC .............. *G11B 5/484* (2013.01); *G11B 5/486* (2013.01); *H05K 1/056* (2013.01); *H05K 3/241* (2013.01); *H05K 1/113* (2013.01); *H05K 3/002* (2013.01)

(58) Field of Classification Search
CPC ........ H05K 3/424; H05K 3/241; H05K 3/002; H05K 1/115; H05K 1/113; H05K 1/056; G11B 5/484; G11B 5/846; Y10T 29/49155
(Continued)

(56) References Cited

U.S. PATENT DOCUMENTS 6,399,989 B1 * 6/2002 Dockerty ............ H01L 27/1203
257/347
9,072,207 B2 * 6/2015 Ooyabu ................. G11B 5/484
(Continued)

FOREIGN PATENT DOCUMENTS

JP   2011-044228 A   3/2011
JP   2011-049462 A   3/2011
(Continued)

OTHER PUBLICATIONS

Office Action, issued by the Japanese Patent Office dated Sep. 5, 2018, in connection with corresponding Japanese Patent Application No. 2015-070165.

*Primary Examiner* — Peter DungBa Vo
*Assistant Examiner* — Kaying Kue
(74) *Attorney, Agent, or Firm* — Edwards Neils, LLC; Jean C. Edwards, Esq.

(57) ABSTRACT

A method for producing a wired circuit board includes a first step of preparing a metal supporting layer; a second step of forming an insulating layer having a first opening and terminal forming portions on the metal supporting layer; a third step of forming a conductor layer having terminal portions and an electrically conductive portion on the insulating layer; a fourth step of, by partially removing the metal supporting layer, forming a metal supporting frame portion, a metal supporting connecting portion, and a reinforcement metal supporting portion; and a fifth step of forming a metal plating layer at surfaces of the terminal portions by electrolytic plating via the metal supporting connecting portion.

6 Claims, 13 Drawing Sheets

(51) Int. Cl.
- *H05K 1/05* (2006.01)
- *H05K 3/24* (2006.01)
- *H05K 1/11* (2006.01)
- *H05K 3/00* (2006.01)

(58) Field of Classification Search
USPC .................................. 29/847, 846, 829, 825
See application file for complete search history.

(56) References Cited

U.S. PATENT DOCUMENTS

| | | | |
|---|---|---|---|
| 9,167,693 B2* | 10/2015 | Okuno | G11B 5/486 |
| 2003/0026078 A1* | 2/2003 | Komatsubara | G11B 5/4853 |
| | | | 361/746 |
| 2010/0032201 A1* | 2/2010 | Ooyabu | G11B 5/484 |
| | | | 174/262 |
| 2011/0048791 A1 | 3/2011 | Ohsawa et al. | |
| 2014/0144680 A1 | 5/2014 | Okuno et al. | |

FOREIGN PATENT DOCUMENTS

| | | |
|---|---|---|
| JP | 2013-093077 A | 5/2013 |
| JP | 2014-123711 A | 7/2014 |

* cited by examiner

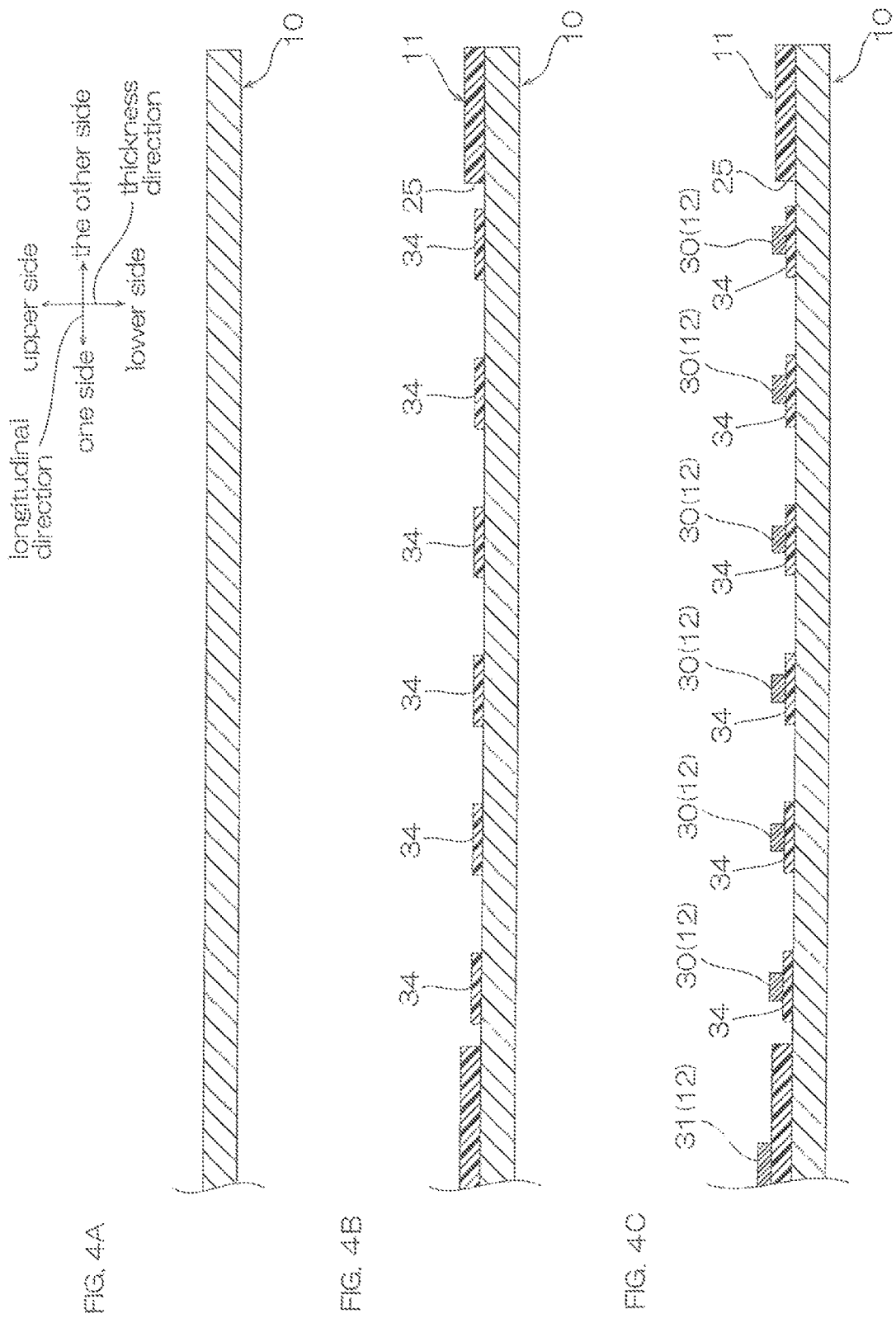

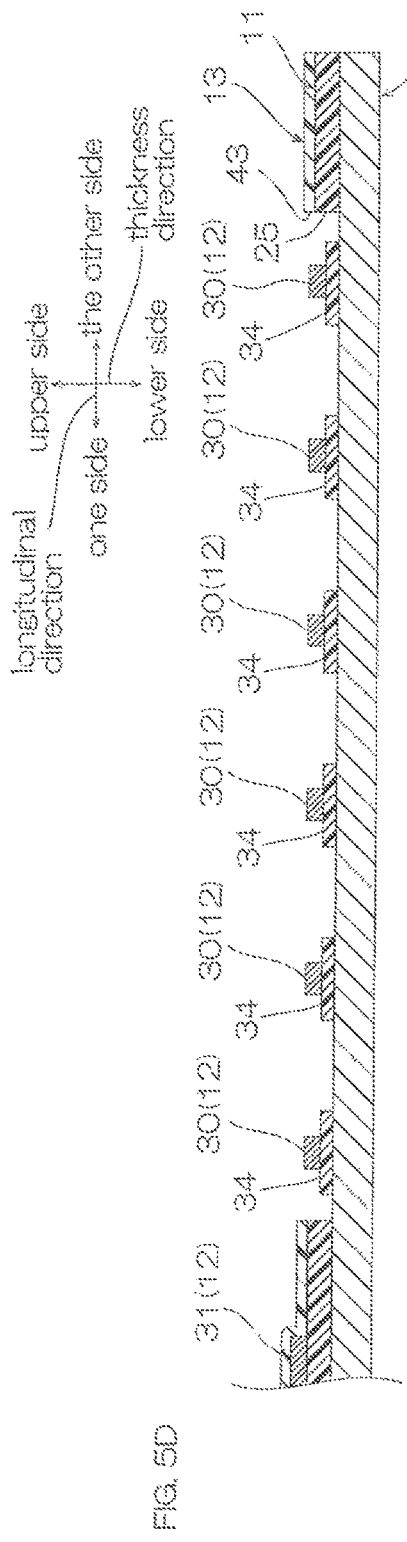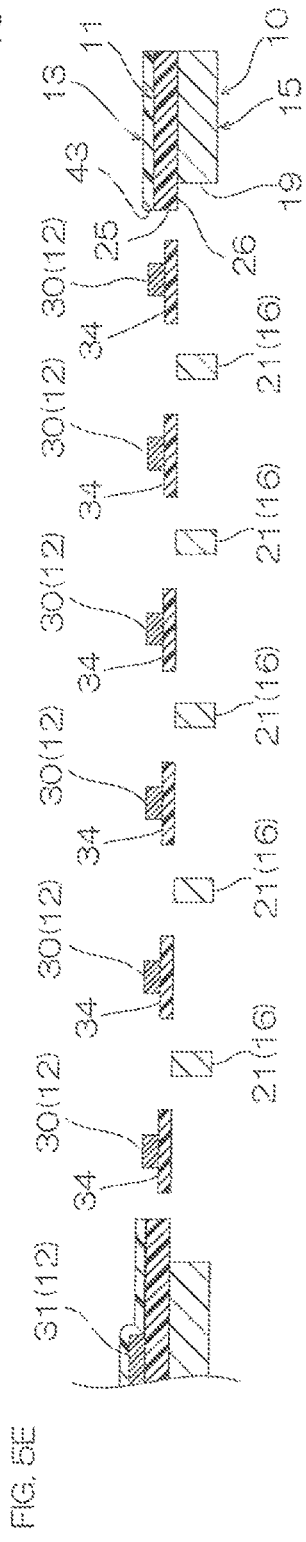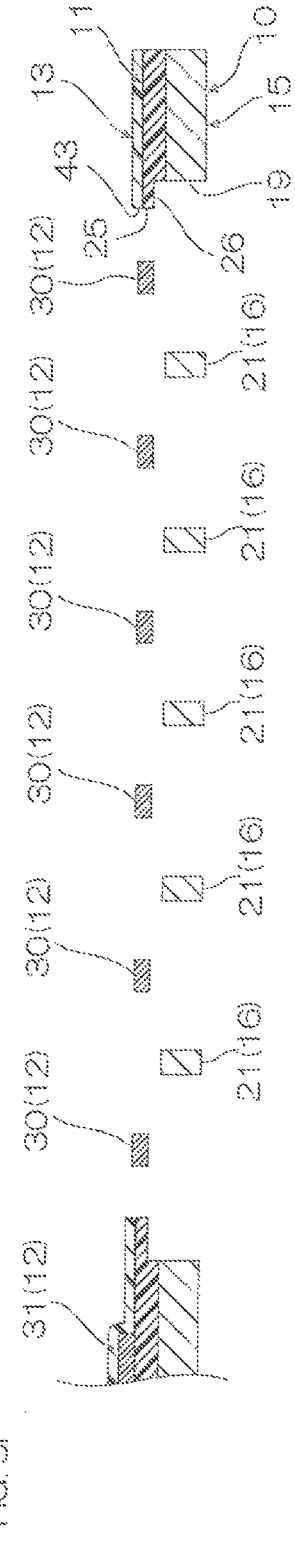

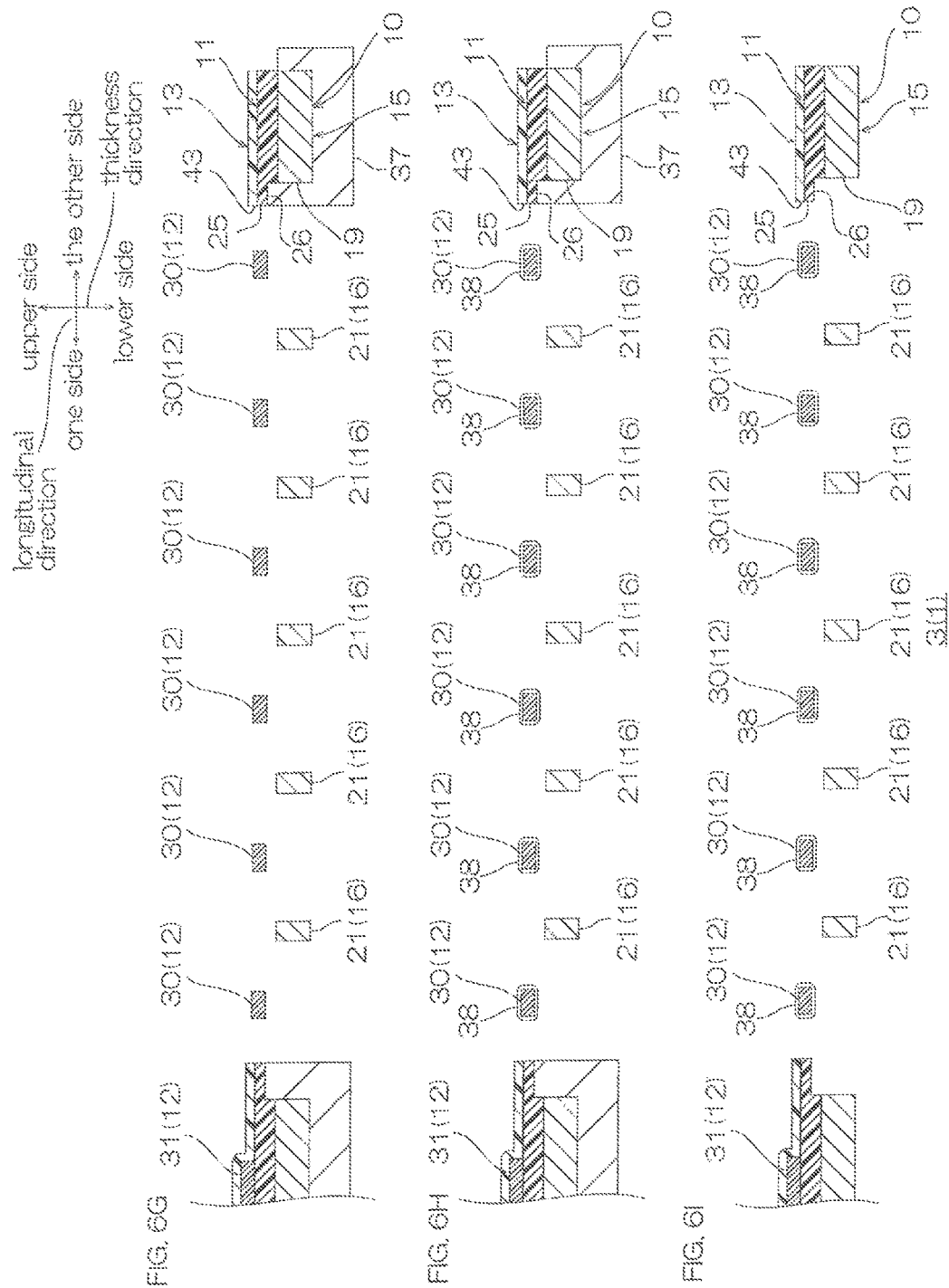

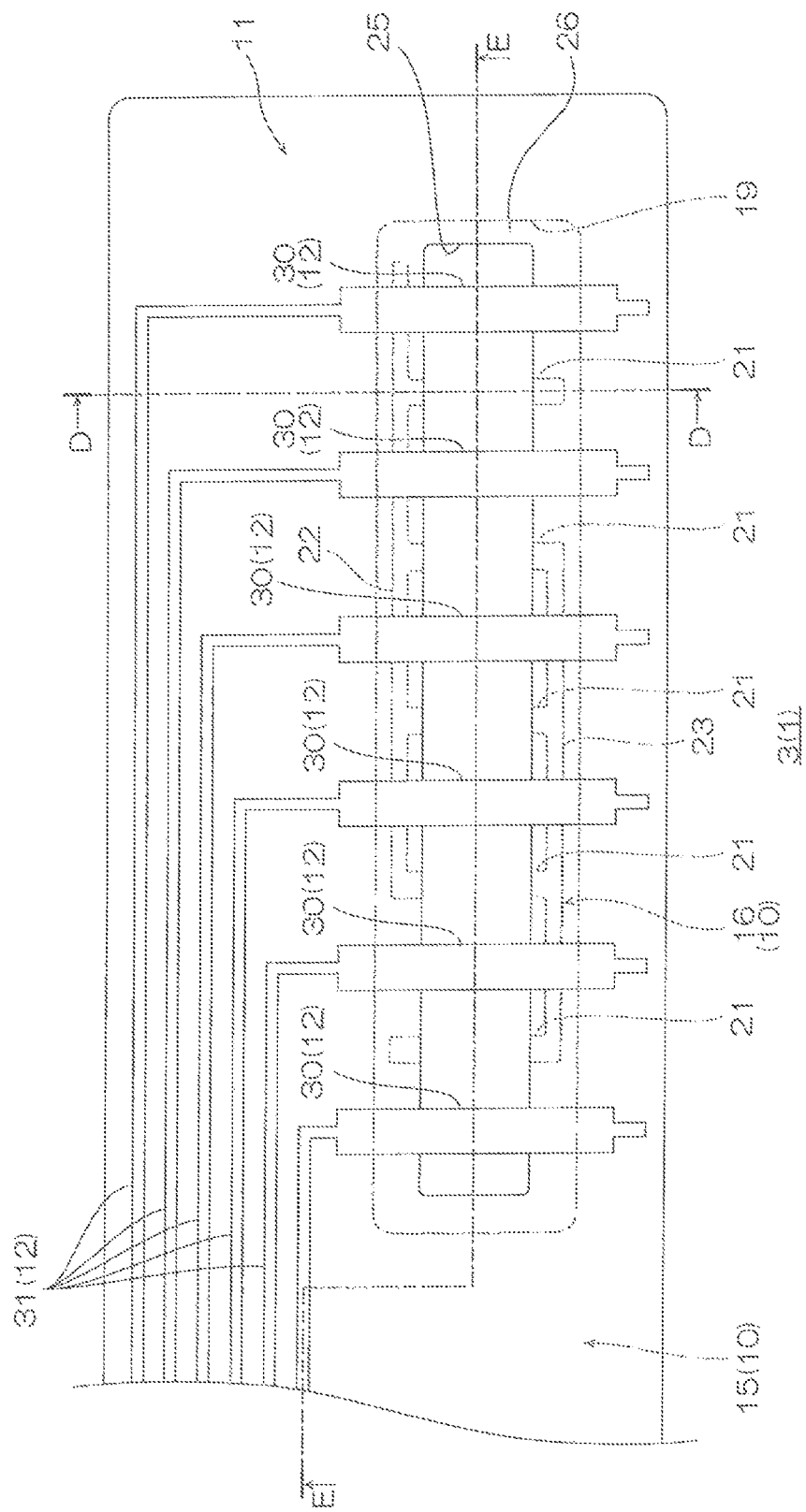

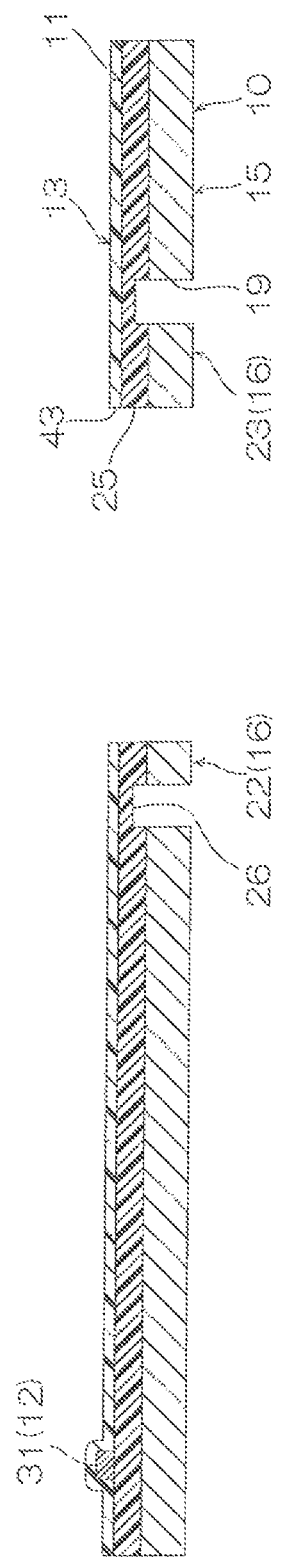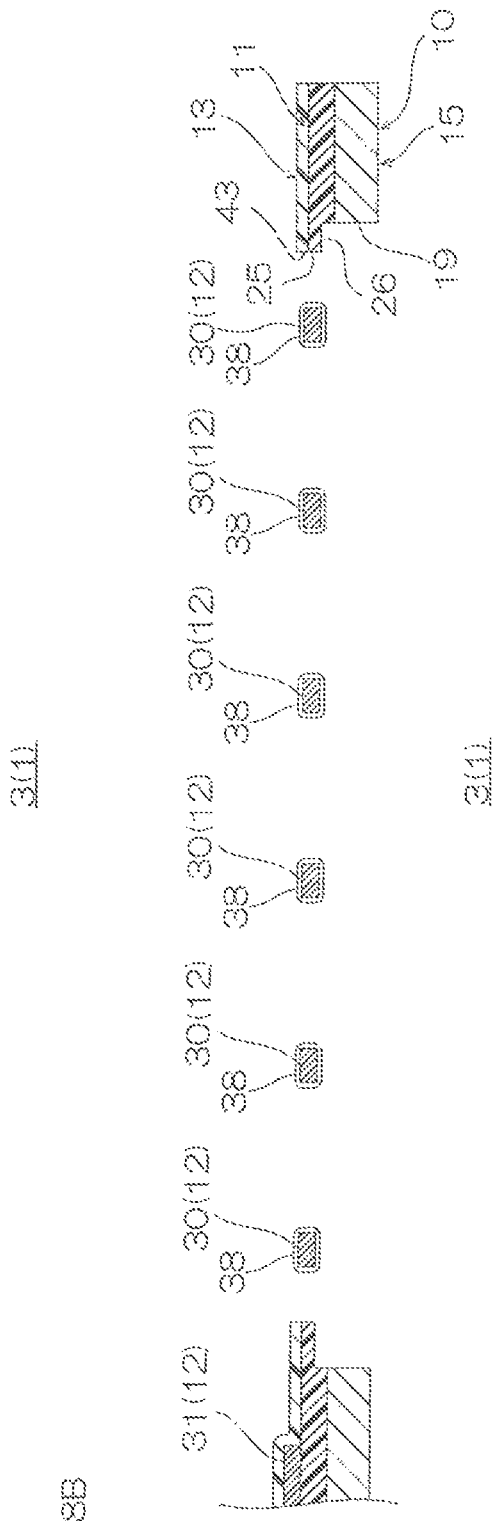

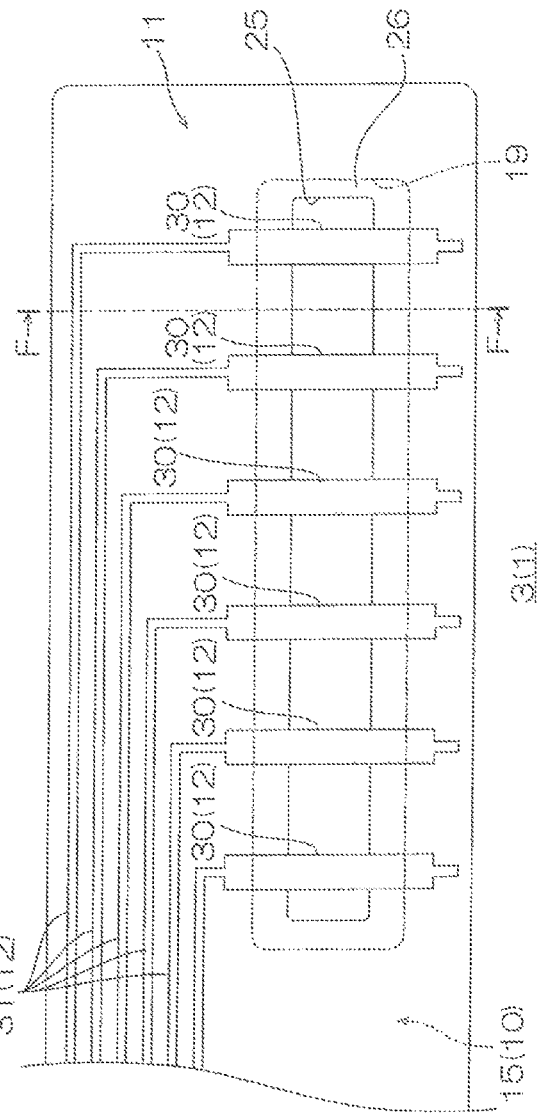
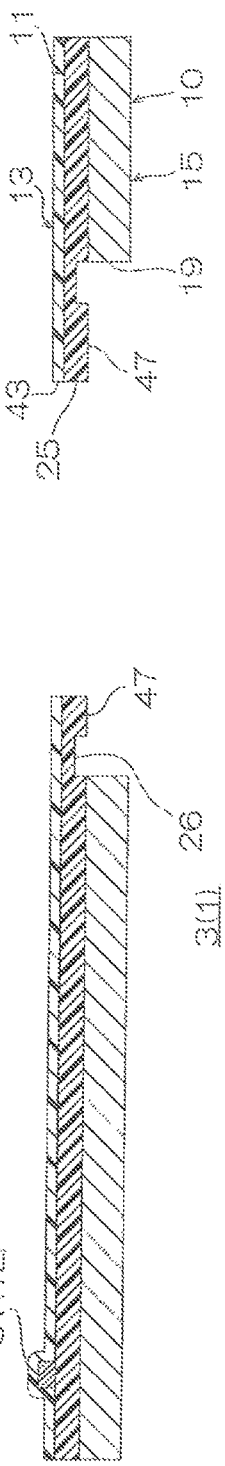
FIG. 9A
FIG. 9B

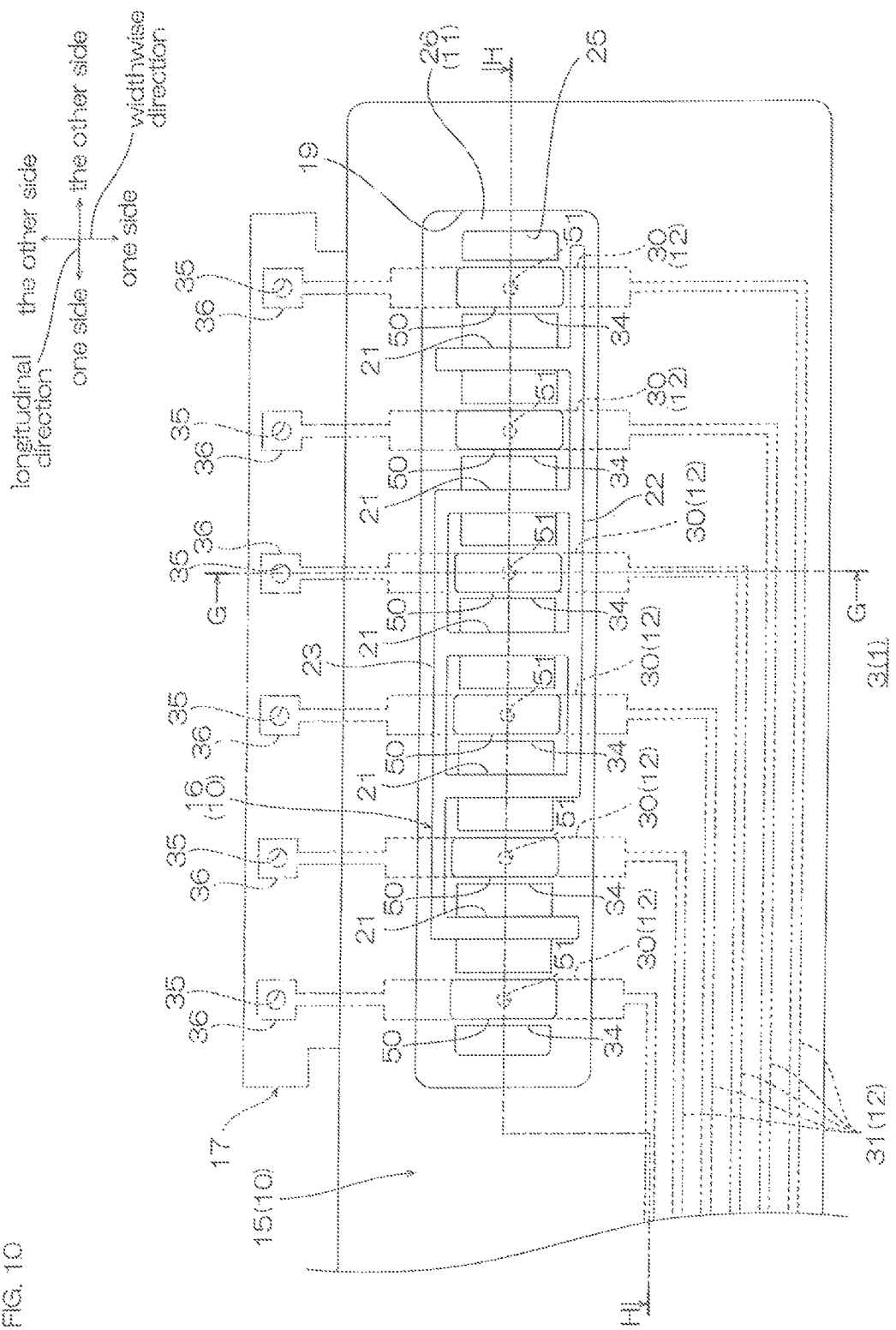

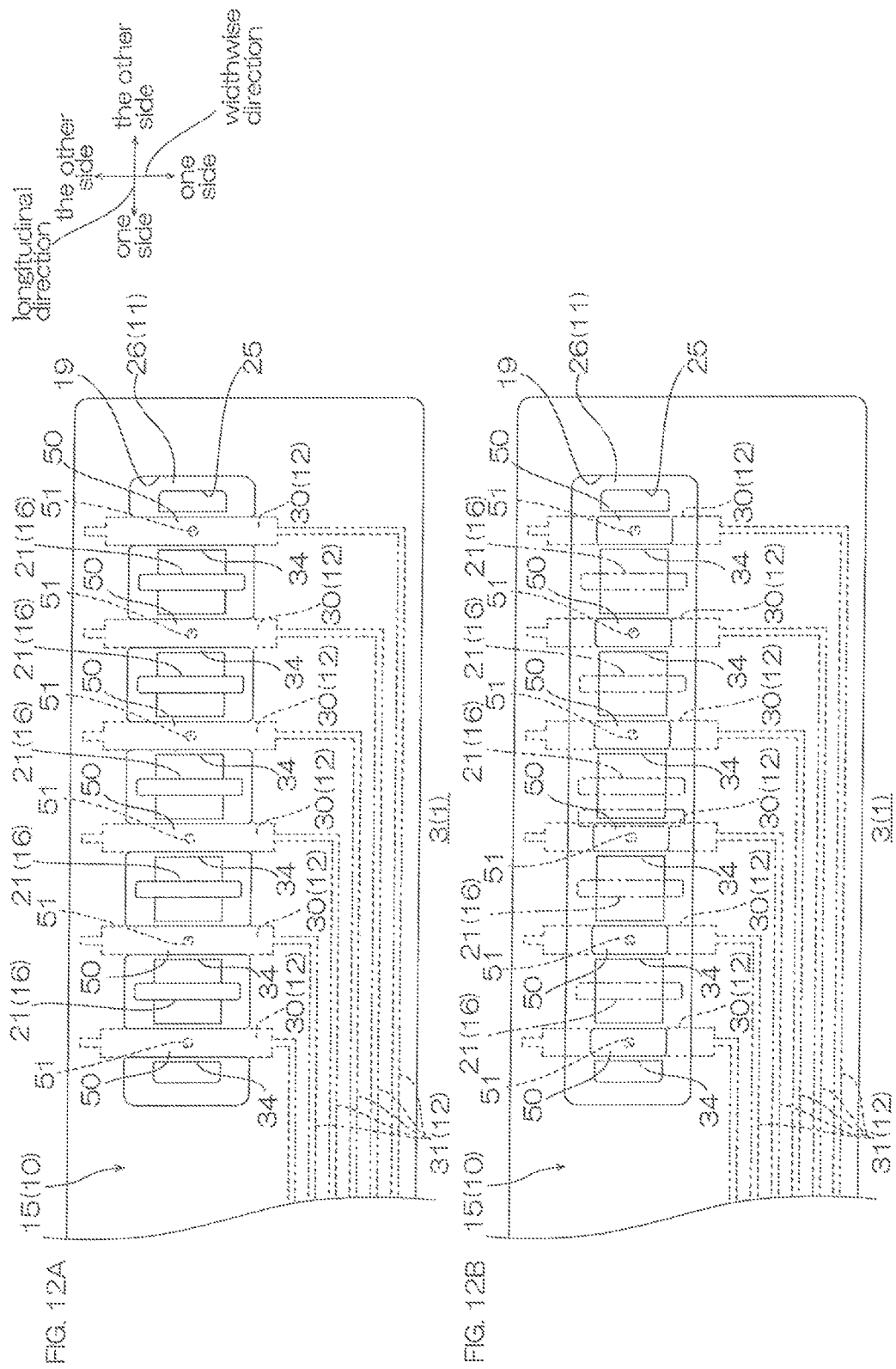

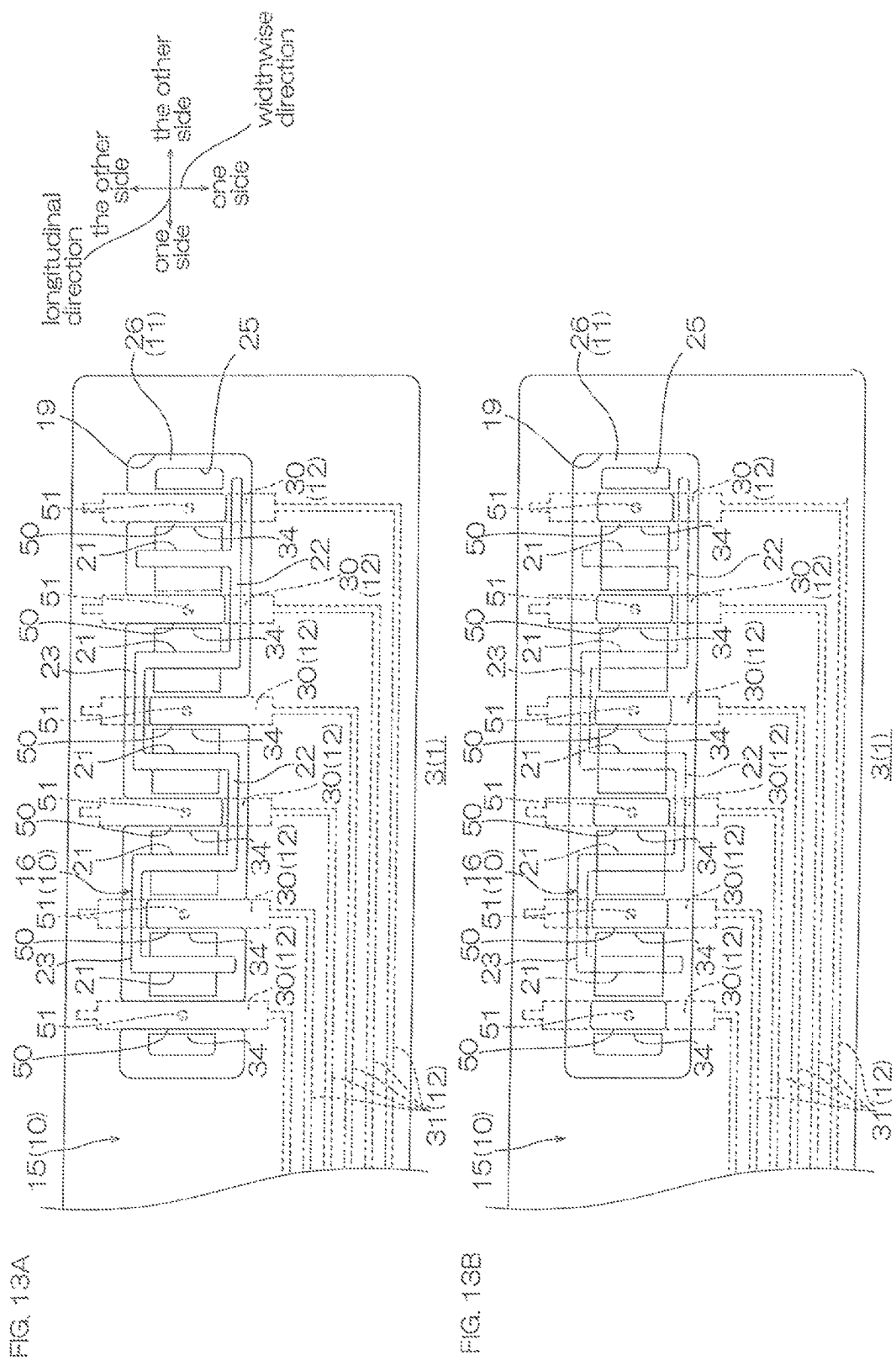

WIRED CIRCUIT BOARD AND PRODUCING METHOD THEREOF

CROSS-REFERENCE TO RELATED APPLICATION

The present application claims priority from Japanese Patent Application No. 2015-070165 filed on Mar. 30, 2015, the contents of which are hereby incorporated by reference into this application.

BACKGROUND OF THE INVENTION

Field of the Invention

The present invention relates to a wired circuit board and a producing method thereof, to be specific, to a wired circuit board preferably used as a suspension board with circuit and a producing method thereof.

Description of Related Art

In a wired circuit board used in an electronic and electrical device or the like, a terminal portion for being connected to an external board is usually formed.

To correspond to high density and miniaturization of the electronic and electrical device, a flying lead in which a terminal portion is formed not only on one surface of a conductor pattern, but also on both surfaces thereof has been recently spread. For example, in a suspension board with circuit or the like to be used in a hard disk drive, it has been known that the terminal portion is formed as the flying lead by disposing the terminal portion so that both surfaces thereof are exposed in an opening formed in a supporting board and an insulating layer.

A plating layer is formed on both surfaces of the thus exposed flying lead by electrolytic plating.

Meanwhile, the terminal portion formed as the flying lead has low rigidity, so that there may be a case where defects such as a sag or a bend occur in the flying lead by impact or vibration on the suspension board with circuit. Then, a suspension board with circuit that is capable of suppressing a sag or a bend of a flying lead by forming a reinforcement supporting portion by leaving a part of a supporting board between a plurality of flying leads at the time of trimming of the supporting board has been proposed (ref: for example, Japanese Unexamined Patent Publication No. 2014-123711).

SUMMARY OF THE INVENTION

In the suspension board with circuit described in Japanese Unexamined Patent Publication No. 2014-123711, there is a disadvantage that when a plating layer is formed with respect to the flying lead by electrolytic plating using the supporting board as a plating lead, a plating layer is not only formed in the flying lead, but also formed in the reinforcement supporting portion that is formed from the supporting board, so that the used amount of plating is increased.

To prevent formation of the plating layer with respect to the reinforcement supporting portion, there is a disadvantage that in the step of plating the flying lead, a step of forming a plating resist with respect to the reinforcement supporting portion and removing it after electrolytic plating is required, so that the number of producing steps is increased.

Furthermore, by forming the plating resist on the front and back surfaces, the plating resists of the front and back surfaces are attached to each other around the reinforcement supporting portion, so that there is a disadvantage that when light is exposed so as to leave the circumference of the reinforcement supporting portion as a mask of the metal plating in a light exposure step, the plating resists of the front and back surfaces are brought into tight contact with each other and a residue remains in a peeling step.

It is an object of the present invention to provide a wired circuit board that is capable of reinforcing a plurality of terminal portions by a reinforcement metal supporting portion, while simplifying a producing step and suppressing the used amount of a metal plating layer, and a producing method thereof.

The present invention [1] includes a method for producing a wired circuit board including a first step of preparing a metal supporting layer; a second step of forming an insulating layer having a first opening and a plurality of terminal forming portions disposed at spaced intervals to each other at the inside of the first opening at one side in a thickness direction of the metal supporting layer; a third step of forming a conductor layer having a plurality of terminal portions corresponding to the respective plurality of terminal forming portions and an electrically conductive portion electrically connecting each of the plurality of terminal portions to the metal supporting layer at one side in the thickness direction of the insulating layer; a fourth step of, by partially removing the metal supporting layer, forming a metal supporting frame portion having a second opening including the first opening, when projected in the thickness direction, a metal supporting connecting portion continuous from the metal supporting frame portion and electrically connected to the electrically conductive portion, and at least one reinforcement metal supporting portion, when projected in the thickness direction, disposed between the plurality of terminal forming portions at the inside of the second opening, traversing the first opening in a direction orthogonal to both directions of an arrangement direction having the plurality of terminal forming portions arranged and the thickness direction, and separated from the metal supporting frame portion; and a fifth step of forming a metal plating layer at surfaces of the plurality of terminal portions by electrolytic plating via the metal supporting connecting portion.

According to the method for producing a wired circuit board, in the fourth step, by partially removing the metal supporting layer so as to separate the metal supporting frame portion from the reinforcement metal supporting portion, the reinforcement metal supporting portion and the metal supporting frame portion can be formed so as to be electrically insulated from each other.

Thus, in the fifth step, when electrolytic plating is applied to the surfaces of the plurality of terminal portions via the metal supporting connecting portion continuous from the metal supporting frame portion, even if a plating resist is not formed on the surface of the reinforcement metal supporting portion, a metal plating layer can be formed in the plurality of terminal portions without being formed in the reinforcement metal supporting portion.

As a result, even in a case where impact or vibration is applied to the wired circuit board, a sag or a bend of the plurality of terminal portions can be suppressed by the reinforcement metal supporting portion that is disposed between the plurality of terminal portions, while the producing step can be simplified and the used amount of the metal plating layer can be suppressed.

The present invention [2] includes the method for producing a wired circuit board described in [1] further including after the fourth step, a terminal forming portion removing step of removing the plurality of terminal forming portions exposed from the second opening and exposing both side surfaces in the thickness direction of the plurality of terminal portions.

According to the method for producing a wired circuit board, by exposing both side surfaces in the thickness direction of the plurality of terminal portions by removing the plurality of terminal forming portions, the plurality of terminal portions can be formed as a flying lead.

Thus, the plurality of terminal portions that are formed as the flying lead can be reinforced by the reinforcement metal supporting portion.

The present invention [3] includes the method for producing a wired circuit board described in [1], wherein in the second step, an insulating layer is formed so as to allow each of the plurality of terminal forming portions to include an insulating through hole passing through in the thickness direction; in the third step, a conductor layer is formed so as to allow the plurality of terminal portions to fill the insulating through holes of the respective plurality of terminal forming portions; and in the fourth step, the metal supporting layer is partially removed so as to form a metal supporting terminal corresponding to each of the plurality of terminal forming portions.

According to the method for producing a wired circuit board, by forming the terminal portions so as to fill the insulating through holes that are formed in the terminal forming portions, the terminal portions can be electrically connected to the metal supporting terminals.

Thus, the electrical connection can be achieved with respect to the terminal portions at the one side in the thickness direction of the wired circuit board and the electrical connection can be achieved with respect to the metal supporting terminals at the other side in the thickness direction of the wired circuit board, while the terminal portions can be reinforced by the metal supporting terminals.

The present invention [4] includes the method for producing a wired circuit board described in any one of [1] to [3] further including after the fifth step, a metal supporting connecting portion removing step of interrupting electrical conduction of the plurality of terminal portions by removing at least a part of the metal supporting connecting portion.

According to the method for producing a wired circuit board, by the metal supporting connecting portion removing step, electrical conduction of the plurality of terminal portions to each other via the metal supporting connecting portion can be interrupted.

As a result, the plurality of terminal portions can be formed as independent terminals.

The present invention [5] includes the method for producing a wired circuit board described in any one of [1] to [4] further including after the fifth step, a reinforcement metal supporting portion removing step of partially removing the reinforcement metal supporting portion so as to leave a portion overlapped with the insulating layer, when projected in the thickness direction.

According to the method for producing a wired circuit board, until the fifth step, a sag or a bend of the terminal portions can be suppressed by the reinforcement metal supporting portion.

After the fifth step, by partially removing the reinforcement metal supporting portion so as to leave the portion that is overlapped with the insulating layer, the terminal portions only can be disposed at the inside of the first opening and the second opening, while the wired circuit board can be reinforced by the remaining portion.

As a result, after the fifth step, the wired circuit board can be partially reinforced by the remaining portion of the reinforcement metal supporting portion, while the electrical connection can be surely achieved at either side of the one side in the thickness direction of the plurality of terminal portions or the other side in the thickness direction thereof.

The present invention [6] includes the method for producing a wired circuit board described in any one of [1] to [5], wherein in the fourth step, the metal supporting layer is partially removed so as to form at least the two reinforcement metal supporting portions and a connecting portion overlapped with the insulating layer, when projected in the thickness direction, and connecting at least the two reinforcement metal supporting portions.

According to the method for producing a wired circuit board, by forming the connecting portion that connects at least the two reinforcement metal supporting portions, a sag or a bend of the terminal portions can be further more surely suppressed.

The present invention [7] includes a wired circuit board produced by the method for producing a wired circuit board described in any one of [1] to [6].

According to the wired circuit board, the wired circuit board is produced by the above-described method for producing a wired circuit board, so that a sag or a bend of the plurality of terminal portions can be suppressed, while the producing step can be simplified and the used amount of the metal plating layer can be suppressed.

BRIEF DESCRIPTION OF THE DRAWINGS

FIGS. 4A to 4C show process drawings for illustrating a producing method in a cross section along a C-C line of the suspension board with circuit shown in FIG. 2:

FIG. 4A illustrating a step of preparing a supporting board,

FIG. 4B illustrating a step of forming a base insulating layer, and

FIG. 4C illustrating a step of forming a conductor pattern.

FIGS. 5D to 5F, subsequent to FIG. 4C, show process drawings for illustrating the producing method in the cross section along the C-C line of the suspension board with circuit shown in FIG. 2:

FIG. 5D illustrating a step of forming a cover insulating layer,

FIG. 5E illustrating a step of trimming the supporting board, and

FIG. 5F illustrating a step of removing a terminal forming portion.

FIGS. 6G to 6I, subsequent to FIG. 5F, show process drawings for illustrating the producing method in the cross section along the C-C line of the suspension board with circuit shown in FIG. 2:

FIG. 6G illustrating a step of forming a plating resist,

FIG. 6H illustrating a step of forming a plating layer, and

FIG. 6I illustrating a step of removing the plating resist.

FIG. 7 shows an enlarged plan view of an external connecting portion of a suspension board with circuit obtained by a method for producing a wired circuit board of a second embodiment of the present invention.

FIG. 8A shows a sectional view along a D-D line in FIG. 7.

FIG. 8B shows a sectional view along an E-E line in FIG. 7.

FIG. 9A shows an enlarged plan view of an external connecting portion of a suspension board with circuit obtained by a method for producing a wired circuit board of a third embodiment of the present invention.

FIG. 9B shows a sectional view along an F-F line in FIG. 9A.

FIG. 10 shows an enlarged bottom view of an external connecting portion of a suspension board with circuit obtained by a method for producing a wired circuit board of a fourth embodiment of the present invention.

FIGS. 12A and 12B show enlarged bottom views of an external connecting portion of a suspension board with circuit obtained by a method for producing a wired circuit board of a fifth embodiment of the present invention:

FIG. 12A illustrating a state in which metal supporting terminals are continuous to a metal supporting frame portion and FIG. 12B illustrating a state in which the metal supporting terminals are electrically insulated from the metal supporting frame portion.

FIGS. 13A and 13B show enlarged bottom views of an external connecting portion of a suspension board with circuit obtained by a method for producing a wired circuit board of a sixth embodiment of the present invention:

FIG. 13A illustrating a state in which metal supporting terminals are continuous to a metal supporting frame portion and FIG. 13B illustrating a state in which the metal supporting terminals are electrically insulated from the metal supporting frame portion.

DETAILED DESCRIPTION OF THE INVENTION

<First Embodiment>

Figure 1:
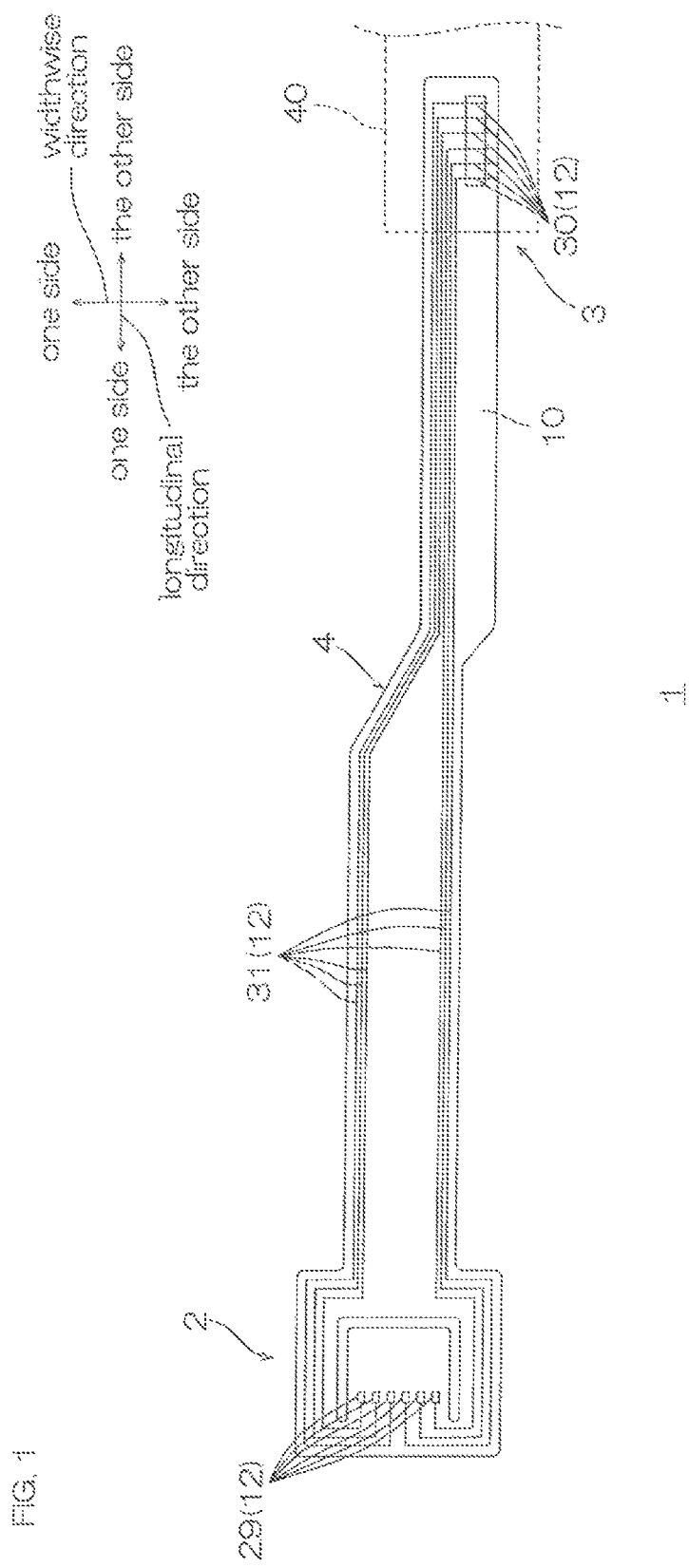
FIG. 1 shows a plan view of a suspension board with circuit obtained by a method for producing a wired circuit board of a first embodiment of the present invention.

As shown in FIG. 1, a suspension board with circuit 1, as one example of a wired circuit board, is mounted with a magnetic head (not shown) to be mounted on a hard disk drive and supports the magnetic head, while keeping a minute interval to a magnetic disk, against an air flow at the time when the magnetic head and the magnetic disk relatively run. The suspension board with circuit 1 integrally includes a wire for connecting the magnetic head to a read/write board as an external circuit.

In FIG. 1, the left side of the paper surface is referred to as one side in a longitudinal direction (arrangement direction) of the suspension board with circuit 1 and the right side of the paper surface is referred to as the other side in the longitudinal direction (arrangement direction) thereof. In FIG. 1, the upper side of the paper surface is referred to as one side in a widthwise direction (orthogonal direction) of the suspension board with circuit 1 and the lower side of the paper surface is referred to as the other side in the widthwise direction (orthogonal direction) thereof. In FIG. 1, the near side of the paper surface is referred to as an upper side (one side in an up-down direction (thickness direction)) of the suspension board with circuit 1 and the far side of the paper surface is referred to as a lower side (the other side in the up-down direction (thickness direction)) thereof.

Figure 2:
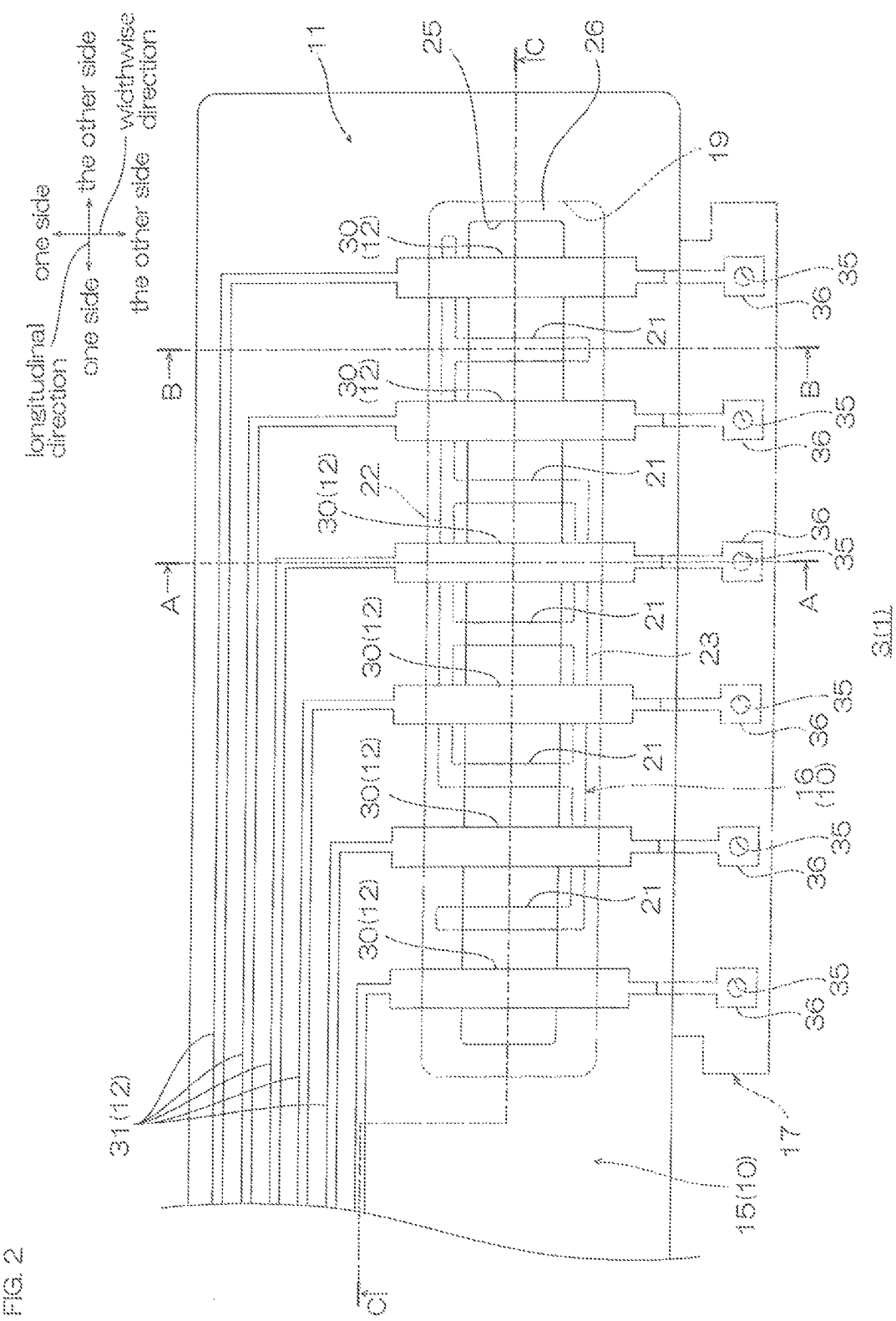
FIG. 2 shows an enlarged plan view of an external connecting portion of the suspension board with circuit shown in FIG. 1.

In FIG. 1, the illustration of a base insulating layer 11 and a cover insulating layer 13 is omitted. In FIG. 2, the illustration of the cover insulating layer 13 is omitted.

The suspension board with circuit 1 has a flat belt shape in a generally rectangular shape in plane view extending in the longitudinal direction. The suspension board with circuit 1 includes a slider mounting portion 2 that is disposed at the one side in the longitudinal direction thereof and mounted with a slider (not shown) including a magnetic head (not shown), an external connecting portion 3 that is disposed at the other side in the longitudinal direction thereof and electrically connected to a read/write board 40, and a wire portion 4 that extends in the longitudinal direction between the slider mounting portion 2 and the external connecting portion 3.

Figure 3A:
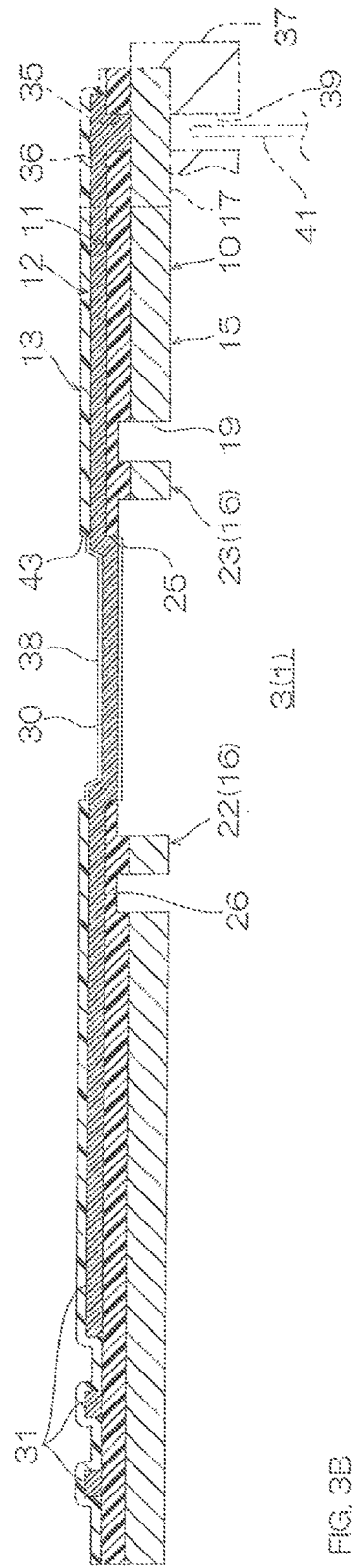
FIG. 3A shows a sectional view along an A-A line in FIG. 2.

As shown in FIGS. 3A and 6I, the suspension board with circuit 1 has a laminate structure. To be specific, in the laminate structure thereof, a supporting board 10 as one example of a metal supporting layer, the base insulating layer 11 as one example of an insulating layer, a conductor pattern 12 as one example of a conductor layer, and the cover insulating layer 13 are sequentially laminated from the lower side upwardly.

The supporting board 10 is, for example, formed of a metal material such as stainless steel, 42-alloy, aluminum, copper-beryllium, and phosphor bronze. Preferably, the supporting board 10 is formed of stainless steel. The supporting board 10 has a generally flat plate shape in a generally rectangular shape in plane view extending in the longitudinal direction (ref: FIG. 1). The supporting board 10 has a thickness of, for example, 10 µm or more, or preferably 15 µm or more, and, for example, 50 µm or less, or preferably 35 µm or less.

As shown in FIGS. 2 and 6I, the supporting board 10 includes a metal supporting frame portion 15 and a reinforcement portion 16 in a portion corresponding to the external connecting portion 3.

The metal supporting frame portion 15 configures the end portion at the other side in the longitudinal direction of the supporting board 10. The metal supporting frame portion 15 includes a board-side opening portion 19 as one example of a second opening.

As shown in FIG. 2, the board-side opening portion 19 is disposed at the other-side portion in the widthwise direction of the metal supporting frame portion 15. The board-side opening portion 19 has a generally rectangular shape in bottom view extending in the longitudinal direction and passes through the metal supporting frame portion 15 in the up-down direction (ref: FIGS. 3A and 6I).

The board-side opening portion 19 has a length in the longitudinal direction of, for example, 4000 µm or more, or preferably 5500 µm or more, and, for example, 20000 µm or less, or preferably 10000 µm or less, and has a length in the widthwise direction of, for example, 50 um or more, or preferably 100 µm or more, and, for example, 3000 µm or less, or preferably 2000 µm or less.

Figure 3B:
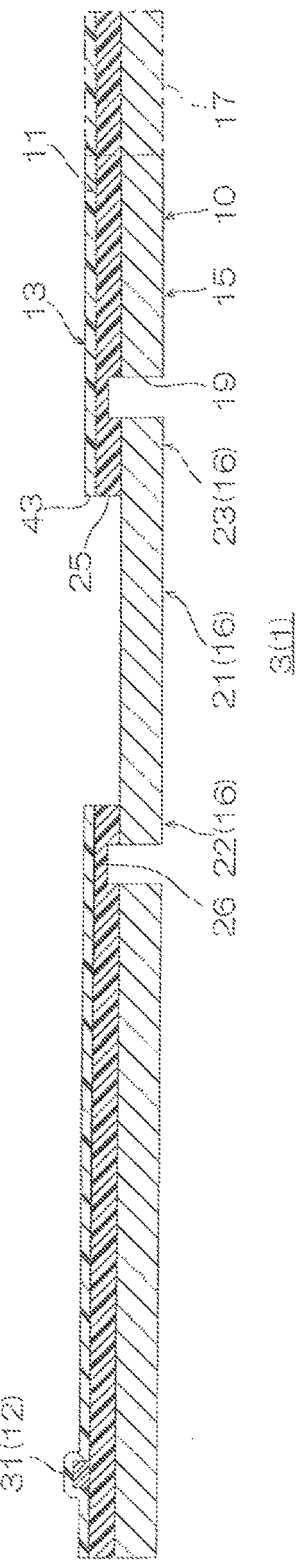
FIG. 3B shows a sectional view along a B-B line in FIG. 2.

The reinforcement portion 16 is, when projected in the up-down direction, disposed at the inside of the board-side opening portion 19 so as to be spaced apart from the inner circumferential surface of the board-side opening portion 19. That is, the reinforcement portion 16 is separated from the metal supporting frame portion 15. In other words, the reinforcement portion 16 is not electrically connected to the metal supporting frame portion 15 and is insulated therefrom. The reinforcement portion 16 has a generally ladder shape in plane view. As shown in FIGS. 2 and 3B, the reinforcement portion 16 includes a plurality of reinforcement metal supporting portions 21, a first connecting portion 22, and a second connecting portion 23.

The plurality of reinforcement metal supporting portions 21 configure generally the central portion in the widthwise direction of the reinforcement portion 16. The plurality of reinforcement metal supporting portions 21 are disposed at spaced intervals (preferably, equal intervals) to each other in the longitudinal direction. Each of the plurality of reinforcement metal supporting portions 21 extends in the widthwise direction.

The reinforcement metal supporting portion 21 has a width (length in the longitudinal direction) of, for example, 30 μm or more, or preferably 50 μm or more, and, for example, 800 μm or less, or preferably 600 μm or less.

An interval between the plurality of reinforcement metal supporting portions 21 is, for example, 50 μm or more, or preferably 100 μm or more, and, for example, 3000 μm or less, or preferably 2000 μm or less.

The first connecting portion 22 configures the one-side end portion in the widthwise direction of the reinforcement portion 16. The first connecting portion 22 extends in the longitudinal direction so as to connect each of the one-side end portions in the widthwise direction of, not the most one-side reinforcement metal supporting portion 21 in the longitudinal direction, but the second, the third, and the fourth reinforcement metal supporting portions 21 from the one side in the longitudinal direction and the most other-side reinforcement metal supporting portion 21 in the longitudinal direction. The other-side end portion in the longitudinal direction of the first connecting portion 22 extends toward the other side in the longitudinal direction with respect to the most other-side reinforcement metal supporting portion 21 in the longitudinal direction.

The first connecting portion 22 has a width (length in the widthwise direction) of, for example, 10 μm or more, or preferably 20 μm or more, and, for example, 500 μm or less, or preferably 400 μm or less.

A length (length in the widthwise direction) from the first connecting portion 22 to the inner circumferential surface of the board-side opening portion 19 is, for example, 5 μm or more, or preferably 10 μm or more, and, for example, 500 μm or less, or preferably 400 μm or less.

The second connecting portion 23 configures the other-side end portion in the widthwise direction of the reinforcement portion 16. The second connecting portion 23 extends in the longitudinal direction so as to connect each of the other-side end portions in the widthwise direction of, not the most other-side reinforcement metal supporting portion 21 in the longitudinal direction, but the most one-side reinforcement metal supporting portion 21 in the longitudinal direction and the second, the third, and the fourth reinforcement metal supporting portions 21 from the one side in the longitudinal direction.

The second connecting portion 23 has a width (length in the widthwise direction) of, for example, 10 μm or more, or preferably 20 μm or more, and, for example, 500 μm or less, or preferably 400 μm or less.

A length (length in the widthwise direction) from the second connecting portion 23 to the inner circumferential surface of the board-side opening portion 19 is, for example, 5 μm or more, or preferably 10 μm or more, and, for example, 500 μm or less, or preferably 400 μm or less.

The supporting board 10 has a cutout in a generally U-shape in plane view having an opening at the one side in the longitudinal direction in a portion corresponding to the slider mounting portion 2.

As shown in FIGS. 3A and 6I, the base insulating layer 11 is laminated on the upper surface of the supporting board 10 and disposed, as a predetermined pattern, in a portion in which the conductor pattern 12 is disposed on the upper surface of the supporting board 10. The base insulating layer 11 is, for example, formed of a synthetic resin. Examples of the synthetic resin include polyimide, polyamide imide, acryl, polyether, nitrile, polyether sulfone, polyethylene terephthalate (PET), polyethylene naphthalate, and polyvinyl chloride. Preferably, in view of thermal dimensional stability or the like, the base insulating layer 11 is formed of polyimide. The base insulating layer 11 has a thickness of, for example, 1 μm or more, or preferably 3 μm or more, and, for example, 25 μm or less, or preferably 15 μm or less.

As shown in FIG. 2, the base insulating layer 11 includes a base-side opening portion 25 as one example of a first opening in a portion corresponding to the board-side opening portion 19 in the supporting board 10.

The base-side opening portion 25 has a generally rectangular shape in bottom view extending in the longitudinal direction and passes through the base insulating layer 11 in the up-down direction (ref: FIGS. 3A and 6I). The base-side opening portion 25 is formed so that the size in the longitudinal direction and the size in the widthwise direction thereof are shorter than the size in the longitudinal direction and the size in the widthwise direction of the board-side opening portion 19, respectively. The base-side opening portion 25 is disposed so that, when projected in the up-down direction, the entire projected surface thereof is included in the inside of the board-side opening portion 19. The length (length in the longitudinal direction) from the one-side end portion in the longitudinal direction of the base-side opening portion 25 to the one-side end portion in the longitudinal direction of the board-side opening portion 19 is the same as the length (length in the longitudinal direction) from the other-side end portion in the longitudinal direction of the base-side opening portion 25 to the other-side end portion in the longitudinal direction of the board-side opening portion 19. Also, the length (length in the widthwise direction) from the one-side end portion in the widthwise direction of the base-side opening portion 25 to the one-side end portion in the widthwise direction of the board-side opening portion 19 is the same as the length (length in the widthwise direction) from the other-side end portion in the widthwise direction of the base-side opening portion 25 to the other-side end portion in the widthwise direction of the board-side opening portion 19.

The base-side opening portion 25 has a length in the longitudinal direction of, for example, 3000 μm or more, or preferably 5000 μm or more, and, for example, 15000 μm or less, or preferably 10000 μm or less, and has a length in the widthwise direction of, for example, 50 μm or more, or preferably 100 μm or more, and, for example, 3000 μm or less, or preferably 2000 μm or less.

In this manner, the base insulating layer 11 is, as seen from below, exposed from the board-side opening portion 19 between the circumferential end edge of the base-side opening portion 25 and that of the board-side opening portion 19. In this manner, a circumferential end portion 26 of the base-side opening portion 25 of the base insulating layer 11 (hereinafter, simply referred to as the circumferential end portion 26) is defined. That is, the circumferential end portion 26 of the base insulating layer 11 is exposed from below via the board-side opening portion 19.

The circumferential end portion 26 is, when projected in the up-down direction, overlapped with both end portions in the widthwise direction of the reinforcement portion 16. To be more specific, the circumferential end portion 26 is, when projected in the up-down direction, overlapped with each of both end portions in the widthwise direction of the plurality of reinforcement metal supporting portions 21, the first connecting portion 22, and the second connecting portion 23 of the reinforcement portion 16. In other words, the reinforcement metal supporting portions 21 of the reinforcement portion 16 are disposed so as to traverse the base-side opening portion 25.

As shown in FIGS. 3A and 6I, the conductor pattern 12 is laminated on the upper surface of the base insulating layer 11. The conductor pattern 12 is, for example, formed of a conductor material such as copper, nickel, gold, and solder or an alloy thereof. Preferably, the conductor pattern 12 is formed of copper. The conductor pattern 12 has a thickness of, for example, 3 μm or more, or preferably 5 μm or more, and, for example, 50 μm or less, or preferably 20 μm or less.

The conductor pattern 12 is disposed on the upper surface of the base insulating layer 11 as a predetermined wired circuit pattern. To be specific, as shown in FIG. 1, the conductor pattern 12 includes a plurality (six pieces) of head-side terminals 29, a plurality (six pieces) of external terminals 30 as one example of a terminal portion, and a plurality (six pieces) of wires 31.

The plurality of head-side terminals 29 are, in the slider mounting portion 2, disposed in parallel at spaced intervals (preferably, equal intervals) to each other in the widthwise direction. Each of the head-side terminals 29 has a generally rectangular shape (square land) in plane view. The head-side terminals 29 are electrically connected to a magnetic head (not shown) of a slider (not shown).

The head-side terminal 29 has a width (length in the widthwise direction) of, for example, 20 μm or more, or preferably 35 μm or more, and, for example, 100 μm or less, or preferably 80 μm or less.

An interval between the plurality of head-side terminals 13 is, for example, 20 μm or more, or preferably 30 μm or more, and, for example, 100 μm or less, or preferably 80 μm or less.

As shown in FIG. 2, the plurality of external terminals 30 are, in the external connecting portion 3, disposed in parallel at spaced intervals to each other in the longitudinal direction. Each of the plurality of external terminals 30 has a generally rectangular shape (square land) in plane view extending in the widthwise direction so as to traverse the board-side opening portion 19 and the base-side opening portion 25, when projected in the up-down direction. Each of the plurality of external terminals 30 is, when projected in the up-down direction, disposed alternately with each of the plurality of reinforcement metal supporting portions 21. To be more specific, the most one-side external terminal 30 in the longitudinal direction is disposed at the one side in the longitudinal direction with respect to the most one-side reinforcement metal supporting portion 21 in the longitudinal direction. The most other-side external terminal 30 in the longitudinal direction is disposed at the other side in the longitudinal direction with respect to the most other-side reinforcement metal supporting portion 21 in the longitudinal direction. Each of the plurality of external terminals 30 between the most one-side external terminal 30 in the longitudinal direction and the most other-side external terminal 30 in the longitudinal direction is, in the longitudinal direction, disposed between the reinforcement metal supporting portions 21 that are adjacent to each other.

Each of the third, the fourth, and the fifth external terminals 30 from the one side in the longitudinal direction and the most other-side external terminal 30 in the longitudinal direction crosses the first connecting portion 22, when projected in the up-down direction. Each of the second, the third, and the fourth external terminals 30 from the one side in the longitudinal direction crosses the second connecting portion 23, when projected in the up-down direction.

In this manner, the lower surfaces at generally the center in the widthwise direction of the plurality of external terminals 30 are exposed below via the board-side opening portion 19 and the base-side opening portion 25.

The external terminal 30 has a width (length in the longitudinal direction) of, for example, 100 μm or more, or preferably 150 μm or more, and, for example, 400 μm or less, or preferably 300 μm or less.

An interval between the plurality of external terminals 30 is, for example, 50 μm or more, or preferably 80 μm or more, and, for example, 1500 μm or less, or preferably 1200 μm or less.

An interval between the external terminal 30 and the reinforcement metal supporting portion 21, when projected in the up-down direction, is, for example, 5 μm or more, or preferably 10 μm or more, and, for example, 1000 μm or less, or preferably 800 μm or less.

The plurality of wires 31 are provided so as to connect the plurality of head-side terminals 29 to the plurality of external terminals 30. To be more specific, the plurality of wires 31 are, in the wire portion 4, disposed in parallel at spaced intervals to each other in the widthwise direction and extend in the longitudinal direction. The wires 31 expand toward both outer sides in the widthwise direction, extend forwardly to then extend inwardly in the widthwise direction, and are folded back rearwardly in the slider mounting portion 2. Then, the rear end portions thereof are connected to the front end portions of the head-side terminals 29. The wires 31 bend toward the other side in the widthwise direction in the external connecting portion 9. Thereafter, the other-side end portions in the widthwise direction thereof are connected to the external terminals 30 (ref: FIG. 2). The wire 31 is formed to be narrower than the head-side terminal 29 and the external terminal 30.

To be more specific, the wire 31 has a width (length in the widthwise direction) of, for example, 8 μm or more, or preferably 10 μm or more, and, for example, 250 μm or less, or preferably 200 μm or less.

An interval between the plurality of wires 31 is, for example, 8 μm or more, or preferably 10 μm or more, and, for example, 250 μm or less, or preferably 200 μm or less.

As shown in FIGS. 3A and 6I, the cover insulating layer 13 is laminated on the upper surface of the base insulating layer 11 so as to cover the conductor pattern 12 from above.

The cover insulating layer 13 is formed of the same synthetic resin as that of the base insulating layer 11. Preferably, the cover insulating layer 13 is formed of polyimide. The cover insulating layer 13 has a thickness of, for example, 2 μm or more, and, for example, 20 μm or less.

The cover insulating layer 13 includes a head-side terminal opening portion (not shown) that exposes the head-side terminals 29 to above and a cover-side opening portion 43 that exposes the external terminals 30 to above.

The cover-side opening portion 43 is formed to have generally the same shape and size as that of the base-side opening portion 25. The cover-side opening portion 43 is formed to pass through in the up-down direction at the other side in the widthwise direction of the rear end portion of the cover insulating layer 13 so as to coincide with the base-side opening portion 25, when projected in the up-down direction.

In this manner, the cover insulating layer 13 covers the upper surfaces of the wires 31 of the conductor pattern 12 and exposes each of the plurality of head-side terminals 29 and each of the plurality of external terminals 30.

In this manner, the lower surfaces of the plurality of external terminals 30 are exposed from the board-side opening portion 19 and the base-side opening portion 25, and the upper surfaces thereof are exposed from the cover-side opening portion 43, so that the plurality of external terminals 30 are configured as a flying lead.

A plating layer 38, as one example of a metal plating layer, is provided on the surfaces of the head-side terminals 29, and the upper surfaces, the lower surfaces, and both side surfaces in the longitudinal direction of the external terminals 30.

The plating layer 38 is, for example, formed of nickel and gold. Preferably, the plating layer 38 is formed of gold.

The plating layer 38 has a thickness of, for example, 0.05 μm or more, or preferably 0.1 μm or more, and, for example, 5 μm or less, or preferably 3 μm or less.

Next, a method for producing the suspension board with circuit 1 is described with reference to FIGS. 4A to 6I.

In the method for producing the suspension board with circuit 1, first, as shown in FIG. 4A, the supporting board 10 is prepared (first step).

Next, as shown in FIG. 4B, the base insulating layer 11 is formed in a portion in which the conductor pattern 12 is formed on the upper surface of the supporting board 10. At this time, in the external connecting portion 3, the base insulating layer 11 is formed in a pattern in which the base-side opening portion 25 that is positioned so that the entire projected surface thereof, when projected in the up-down direction, is included in the inside of the board-side opening portion 19 is formed and a plurality of terminal forming portions 34 corresponding to the plurality of external terminals 30 are formed (second step).

The plurality of terminal forming portions 34 are formed so as to connect the one side to the other side in the widthwise direction of the base-side opening portion 25 in the base insulating layer 11 and disposed at spaced intervals to each other in the longitudinal direction. In a subsequent step, the terminal forming portions 34 are removed after the plurality of external terminals 30 are formed on the upper surfaces thereof.

At this time, a plurality of electrically conductive opening portions 35 are simultaneously formed at the other side in the widthwise direction with respect to the base-side opening portion 25 for electrolytic plating to be described later (ref: FIGS. 2 and 3A).

The plurality of electrically conductive opening portions 35 are disposed in parallel at spaced intervals to each other in the longitudinal direction and pass through the base insulating layer 11 in the up-down direction.

To form the base insulating layer 11 on the upper surface of the supporting board 10, for example, a solution (varnish) of a synthetic resin having photosensitivity that is a material of the base insulating layer 11 is applied to the upper surface of the supporting board 10 to be then dried, thereby forming a base film having photosensitivity. Next, the base film having photosensitivity is exposed to light (gradation exposure to light) via a gradation exposure photomask that is not shown. The gradation exposure photomask includes a light shielding portion, a light semi-transmitting portion, and a light fully transmitting portion in a pattern. The light fully transmitting portion to a portion in which the base insulating layer 11 excluding the terminal forming portions 34 is formed; the light semi-transmitting portion to a portion in which the terminal forming portions 34 are formed; and the light shielding portion to a portion in which the electrically conductive opening portions 35 are formed (ref: FIGS. 2 and 3A) and a portion in which the base insulating layer 11 is not formed are disposed in opposed relation to the base film to be then exposed to light. Thereafter, the base film is developed to be then cured by heating.

In this manner, the base insulating layer 11 is formed in a pattern including the base-side opening portion 25, the terminal forming portions 34, and the electrically conductive opening portions 35.

The terminal forming portion 34 has a thickness of, for example, 0.5 μm or more, or preferably 1 μm or more, and, for example, 15 μm or less, or preferably 10 μm or less.

The width (length in the longitudinal direction) of terminal forming portion 34 with respect to that (length in the longitudinal direction) of the external terminal 30 is set to be, for example, the same length or more, or preferably, the width of the external terminal 30+20 μm or more, and, for example, the width of the external terminal 30+200 μm or less, or preferably the width of the external terminal 30+100 μm or less.

Next, as shown in FIG. 4C, the conductor pattern 12 is formed on the upper surface of the base insulating layer 11 in a pattern in which the head-side terminals 29, the external terminals 30, and the wires 31 are formed and electrically conductive wires 36 (ref: FIGS. 2 and 3A), as one example of an electrically conductive portion, extending from the external terminals 30 are formed for the electrolytic plating to be described later (third step).

At this time, in the external connecting portion 3, each of the plurality of external terminals 30 is formed on the upper surface of each of the plurality of terminal forming portions 34 of the base insulating layer 11.

The plurality of electrically conductive wires 36 extend continuously from the plurality of external terminals 30 toward the other side in the widthwise direction and are electrically connected to the supporting board 10 by filling the electrically conductive opening portions 35. In a subsequent step, the electrically conductive wires 36 are removed after the plating layer 38 is formed on the head-side terminals 29 and the external terminals 30.

To form the conductor pattern 12 on the upper surface of the base insulating layer 11, the conductor pattern 12 may be formed on the upper surface of the base insulating layer 11 by, for example, a known patterning method such as a subtractive method or an additive method. Preferably, an additive method is used.

In this manner, the conductor pattern 12 including the plurality of head-side terminals 29, the plurality of external terminals 30, the plurality of wires 31, and the electrically conductive wires 36 is formed on the upper surface of the base insulating layer 11.

Next, as shown in FIG. 5D, the cover insulating layer 13 having the cover-side opening portion 43 and a head-side terminal opening portion (not shown) is formed on the upper surface of the base insulating layer 11.

To form the cover insulating layer 13 on the upper surface of the base insulating layer 11, for example, a synthetic resin (varnish) having photosensitivity is applied to the upper surface of the base insulating layer 11 including the wires 31 and the electrically conductive wires 36 (ref: FIGS. 2 and 3A), thereby forming a cover film having photosensitivity.

Thereafter, the obtained cover film is exposed to light via a photomask that is not shown and developed to be then cured by heating in the same manner as the base insulating layer 11.

In this manner, the cover insulating layer 13 covers the wires 31 and the electrically conductive wires 36, and the cover insulating layer 13 having the head-side terminal opening portion (not shown) and the cover-side opening portion 43 is formed on the upper surface of the base insulating layer 11.

Then, the upper surfaces of the external terminals 30 of the conductor pattern 12 are exposed to above via the cover-side opening portion 43 in the cover insulating layer 13. The head-side terminals 29 of the conductor pattern 12 are exposed to above via the head-side terminal opening portion (not shown). The plurality of wires 31 and the electrically conductive wires 36 of the conductor pattern 12 are covered with the cover insulating layer 13.

Next, as shown in FIG. 5E, the supporting board 10 is partially removed and a cutout in a generally U-shape in plane view is formed in a portion corresponding to the slider mounting portion 2 in the supporting board 10. Also, the metal supporting frame portion 15 having the board-side opening portion 19 and the reinforcement portion 16 are formed in a portion corresponding to the external connecting portion 3 (fourth step).

At this time, the supporting board 10 is partially removed so that the metal supporting frame portion 15 includes the electrically conductive opening portions 35 in the base insulating layer 11 and an electrically conductive supporting portion 17 (ref: FIGS. 2 and 3A), as one example of a metal supporting connecting portion, extending toward the lower sides of the electrically conductive wires 36 of the conductor pattern 12. In this manner, the electrically conductive wires 36 are electrically connected to the electrically conductive supporting portion 17 of the metal supporting frame portion 15 in the supporting board 10. In a subsequent step, the electrically conductive supporting portion 17 is removed after the plating layer 38 is formed on the head-side terminals 29 and the external terminals 30.

To form the metal supporting frame portion 15 having the board-side opening portion 19 and the electrically conductive supporting portion 17 and the reinforcement portion 16, for example, an etching method such as dry etching (for example, plasma etching) or wet etching (for example, chemical etching); drilling; or laser processing is used. Preferably, wet etching is used.

In this manner, the metal supporting frame portion 15 having the board-side opening portion 19 and the electrically conductive supporting portion 17 and the reinforcement portion 16 are formed in the supporting board 10.

Next, as shown in FIG. 5F, the terminal forming portions 34 that are exposed from the board-side opening portion 19 are removed by the above-described etching method such as wet etching (for example, chemical etching) (terminal forming portion removing step).

In the wet etching, a portion other than the terminal forming portions 34 in the base insulating layer 11 is subjected to masking by each of the supporting board 10 and the etching resist (not shown), so that the undesired etching of the base insulating layer 11 is prevented.

In this manner, the lower surfaces of the plurality of external terminals 30 are exposed from the base-side opening portion 25 and the board-side opening portion 19, so that the plurality of external terminals 30 are configured as a flying lead.

Next, the plating layer 38 is formed on the surfaces of the head-side terminals 29 and the external terminals 30 by electrolytic plating (fifth step).

In the electrolytic plating, first, as shown in FIG. 6G, a plating resist 37 having a resist opening portion 39 (ref: FIG. 3A) is formed on the surface of the conductor pattern 12 excluding the surfaces of the head-side terminals 29 and the external terminals 30 and on the surfaces (including the upper and lower surfaces) of the supporting board 10 excluding the surfaces of the reinforcement metal supporting portions 21.

As shown in FIG. 3A, the resist opening portion 39 passes through the plating resist 37 in the up-down direction so as to expose a part of the lower surface of the electrically conductive supporting portion 17 of the metal supporting frame portion 15.

Next, an electric power supply portion 41 is brought into contact with the electrically conductive supporting portion 17 of the metal supporting frame portion 15 from the resist opening portion 39 of the plating resist 37, while the supporting board 10 is immersed in an electrolytic plating bath, so that an electric power is supplied to the head-side terminals 29 and the external terminals 30 via the electrically conductive wires 36.

In this manner, as shown in FIG. 6H, the plating layer 38 is formed on the head-side terminals 29 and the external terminals 30. Meanwhile, the plating layer 38 is not formed in the reinforcement portion 16.

Next, as shown in FIG. 6I, the plating resist 37 is, for example, removed by etching or peeling.

Then, a connecting portion to the external terminals 30 in the electrically conductive wires 36 is, for example, removed by the above-described etching method such as wet etching (for example, chemical etching).

In this manner, electrical conduction between the external terminals 30 and the electrically conductive supporting portion 17 via the electrically conductive wires 36 is interrupted, so that the supporting board 10 is electrically insulated from the conductor pattern 12.

Thereafter, the supporting board 10 is trimmed and the electrically conductive supporting portion 17 in the metal supporting frame portion 15 is removed.

To trim the supporting board 10, for example, an etching method such as dry etching (for example, plasma etching) or wet etching (for example, chemical etching); drilling; or laser processing is used. Preferably, wet etching is used.

As described above, the production of the suspension board with circuit 1 is completed.

According to the suspension board with circuit 1 and the method for producing the suspension board with circuit 1, as shown in FIG. 5E, in the fourth step, by partially removing the supporting board 10 so as to separate the metal supporting frame portion 15 from the reinforcement portion 16, the reinforcement portion 16 and the metal supporting frame portion 15 can be formed so as to be electrically insulated from each other.

Thus, as shown in FIGS. 3A and 6H, in the fifth step, when electrolytic plating is applied to the surfaces of the plurality of external terminals 30 via the electrically conductive supporting portion 17 of the metal supporting frame portion 15, even if the plating resist 37 is not formed on the surface of the reinforcement portion 16, the plating layer 38 can be formed on the plurality of external terminals 30 without being formed on the reinforcement portion 16.

As a result, even in a case where impact or vibration is applied to the suspension board with circuit 1, a sag or a bend of the plurality of external terminals 30 can be suppressed by the reinforcement metal supporting portions 21 of the reinforcement portion 16 that are disposed between the plurality of external terminals 30, while the producing step can be simplified and the used amount of the plating layer 38 can be suppressed.

According to the suspension board with circuit 1 and the method for producing the suspension board with circuit 1, as shown in FIG. 5F, by exposing both side surfaces in the thickness direction of the plurality of external terminals 30 by removing the plurality of terminal forming portions 34, the plurality of external terminals 30 can be formed as a flying lead.

Thus, the plurality of external terminals 30 that are formed as the flying lead can be reinforced by the reinforcement metal supporting portions 21 of the reinforcement portion 16.

According to the suspension board with circuit 1 and the method for producing the suspension board with circuit 1, as shown in FIG. 2, by forming the first connecting portion 22 and the second connecting portion 23 that connect the plurality of reinforcement metal supporting portions 21, a sag or a bend of the external terminals 30 can be further more surely suppressed.

In the fourth step, the electrically conductive supporting portion 17 can be also formed so as to be separated from the metal supporting frame portion 15 without being continuous thereto.

In such a case, in the fifth step, by bringing the electric power supply portion 41 into contact with the electrically conductive supporting portion 17, an electric power is supplied to the head-side terminals 29 and the external terminals 30 via the electrically conductive wires 36, so that the plating layer 38 can be formed.

<Second Embodiment>

In a second embodiment of the suspension board with circuit 1, as shown in FIGS. 7, 8A, and 8B, with respect to the above-described first embodiment, a portion other than the portion, when projected in the up-down direction, overlapped with the circumferential end portion 26 in the reinforcement portion 16 in the external connecting portion 3, that is, the reinforcement metal supporting portions 21 that are exposed from the base-side opening portion 25 are removed.

In FIG. 7, the illustration of the cover insulating layer 13 is omitted.

To obtain the suspension board with circuit 1, in the step of removing the electrically conductive supporting portion 17, the reinforcement metal supporting portions 21 that are exposed from the base-side opening portion 25 are removed by trimming (reinforcement metal supporting portion removing step).

According to the second embodiment of the suspension board with circuit 1 and the method for producing the suspension board with circuit 1, as shown in FIG. 6I, until the fifth step, a sag or a bend of the external terminals 30 can be suppressed by the reinforcement portion 16.

After the fifth step, as shown in FIGS. 7, 8A, and 8B, by partially removing the reinforcement metal supporting portions 21 of the reinforcement portion 16 so as to leave the portion that is overlapped with the base insulating layer 11, the external terminals 30 only can be disposed at the inside of the base-side opening portion 25 and the board-side opening portion 19, while the suspension board with circuit 1 can be reinforced by the remaining portion.

As a result, after the fifth step, the suspension board with circuit 1 can be partially reinforced by the remaining portion of the reinforcement metal supporting portions 21, while the electrical connection can be surely achieved at either side of the upper sides or the lower sides of the plurality of external terminals 30.

In the second embodiment of the suspension board with circuit 1 and the method for producing the suspension board with circuit 1, the same function and effect as that of the above-described embodiment can be obtained.

<Third Embodiment>

In a third embodiment of the suspension board with circuit 1, as shown in FIGS. 9A and 9B, with respect to the above-described second embodiment, in the external connecting portion 3, the entire reinforcement portion 16 at the inside of the board-side opening portion 19 is removed.

In FIG. 9A, the illustration of the cover insulating layer 13 is omitted.

To obtain the suspension board with circuit 1, in the step of removing the electrically conductive supporting portion 17, the entire reinforcement portion 16 at the inside of the board-side opening portion 19 is removed by trimming As shown in FIG. 5F, in the circumferential end portion 26 of the base insulating layer 11, in a portion that is, when projected in the thickness direction, not overlapped with the reinforcement portion 16, the thickness of a part thereof is thin by etching.

In this manner, as shown in FIG. 9B, in the circumferential end portion 26 of the base insulating layer 11, the thickness of a portion that is, when projected in the thickness direction, overlapped with the reinforcement portion 16 is thick, compared to that of the portion that is not overlapped with the reinforcement portion 16. The portion that is overlapped with the reinforcement portion 16 is defined as a base overlapped portion 47.

According to the third embodiment of the suspension board with circuit 1 and the method for producing the suspension board with circuit 1, as shown in FIG. 6I, until the fifth step, a sag or a bend of the external terminals 30 can be suppressed by the reinforcement portion 16.

After the fifth step, the suspension board with circuit 1 can be partially reinforced by the base overlapped portion 47, while the electrical connection can be surely achieved at either side of the upper sides or the lower sides of the plurality of external terminals 30.

In the third embodiment of the suspension board with circuit 1 and the method for producing the suspension board with circuit 1, the same function and effect as that of the above-described embodiment can be obtained.

<Fourth Embodiment>

Figure 11A:
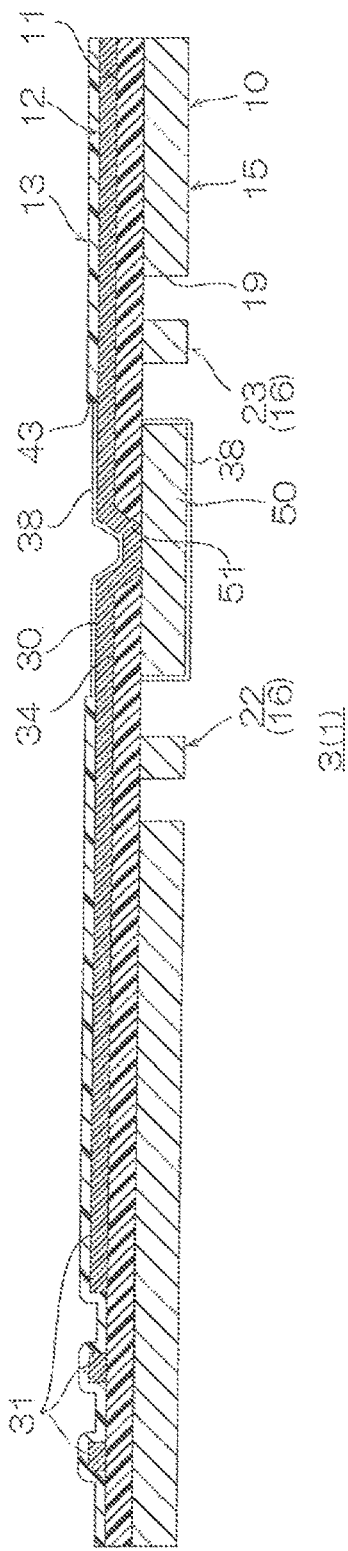
FIG. 11A shows a sectional view along a G-G line in FIG. 10.
Figure 11B:
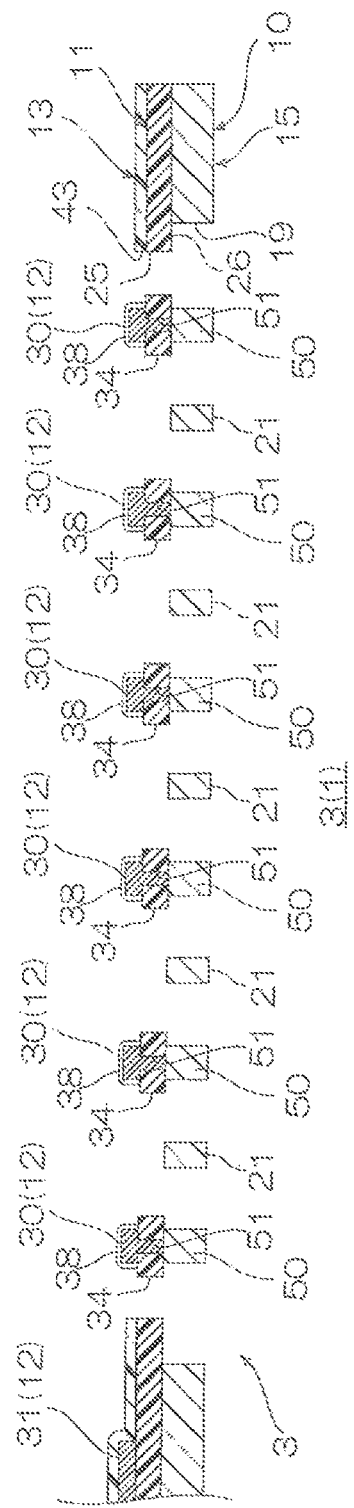
FIG. 11B shows a sectional view along an H-H line in FIG. 10.

In a fourth embodiment of the suspension board with circuit 1, as shown in FIGS. 10, 11A and 11B, with respect to the above-described first embodiment, in the external connecting portion 3, the plurality of terminal forming portions 34 of the base insulating layer 11 are not removed and are left, and the supporting board 10 includes a plurality of metal supporting terminals 50.

The terminal forming portions 34 of the base insulating layer 11 include connecting opening portions 51 as one example of an insulating through hole.

The connecting opening portions 51 pass through generally the central portion in plane view of the terminal forming portions 34 in the up-down direction.

Each of the plurality of metal supporting terminals 50 is disposed on the lower surface of the corresponding terminal forming portion 34. That is, the plurality of metal supporting terminals 50 are disposed at spaced intervals to each other in the longitudinal direction in the same manner as the terminal forming portions 34. The plurality of metal supporting terminals 50 are, when projected in the up-down direction, disposed at the inside of the board-side opening portion 19 so as to be spaced apart from the inner circumferential surface of the board-side opening portion 19. Each of the plurality of metal supporting terminals 50 extends in the widthwise direction.

The plurality of metal supporting terminals 50 are electrically connected to the respective external terminals 30 via the connecting opening portions 51.

To obtain the suspension board with circuit 1, in the above-described second step, each of the plurality of terminal forming portions 34 is formed so as to include the connecting opening portion 51.

Next, in the third step, the external terminals 30 are formed so as to fill the connecting opening portions 51 and to be electrically connected to the supporting board 10.

Next, in the fourth step, the supporting board 10 is partially removed so that the metal supporting frame portion 15 having the board-side opening portion 19 and the reinforcement portion 16 are formed, and the plurality of metal supporting terminals 50 are formed.

In the fifth step, the plating resist 37 is also formed on the surfaces of the metal supporting terminals 50, and an electric power is supplied to the head-side terminals 29 and the external terminals 30 via the electrically conductive supporting portion 17.

As described above, the production of the fourth embodiment of the suspension board with circuit 1 is completed.

According to the fourth embodiment of the suspension board with circuit 1 and the method for producing the suspension board with circuit 1, as shown in FIGS. 10, 11A, and 11B, by forming the external terminals 30 so as to fill the connecting opening portions 51 that are formed in the terminal forming portions 34, the external terminals 30 can be electrically connected to the metal supporting terminals 50.

Thus, the electrical connection can be achieved with respect to the external terminals 30 at the upper side of the suspension board with circuit 1 and the electrical connection can be achieved with respect to the metal supporting terminals 50 at the lower side of the suspension board with circuit 1, while the external terminals 30 can be reinforced by the metal supporting terminals 50.

In the fourth embodiment of the suspension board with circuit 1 and the method for producing the suspension board with circuit 1, the same function and effect as that of the above-described embodiment can be obtained.

In the fourth embodiment, the reinforcement portion 16 at the inside of the board-side opening portion 19 can be also removed in the same manner as the above-described third embodiment.

<Fifth Embodiment>

In a fifth embodiment of the suspension board with circuit 1, as shown in FIGS. 12A and 12B, with respect to the above-described fourth embodiment, in the producing step thereof, the reinforcement portion 16 of the external connecting portion 3 fails to include the first connecting portion 22 and the second connecting portion 23 and includes the plurality of reinforcement metal supporting portions 21 only, and both end portions in the widthwise direction of the metal supporting terminals 50 are continuous to the inner circumferential surface of the board-side opening portion 19.

In the fifth embodiment, the metal supporting terminals 50 are configured as one example of a metal supporting connecting portion.

To obtain the suspension board with circuit 1, in the fourth step, as shown in FIG. 12A, the first connecting portion 22 and the second connecting portion 23 of the reinforcement portion 16 are not formed, and the reinforcement metal supporting portions 21 only are formed. The plurality of metal supporting terminals 50 are formed so that both end portions in the widthwise direction thereof are continuous to the inner circumferential surface of the board-side opening portion 19.

Next, in the fifth step, the electric power supply portion 41 is brought into contact with at least one piece of metal supporting terminal 50 of the plurality of metal supporting terminals 50 at the inside of the board-side opening portion 19, so that an electric power is supplied to the head-side terminals 29 and the external terminals 30 via the metal supporting terminals 50 and the metal supporting frame portion 15.

Thereafter, the supporting board 10 is trimmed and both end portions in the widthwise direction of the metal supporting terminals 50 are removed (metal supporting connecting portion removing step).

In this manner, the plurality of metal supporting terminals 50 are, when projected in the up-down direction, disposed at the inside of the board-side opening portion 19 so as to be spaced apart from the inner circumferential surface of the board-side opening portion 19 and electrically insulated from the metal supporting frame portion 15.

According to the fifth embodiment of the suspension board with circuit 1 and the method for producing the suspension board with circuit 1, as shown in FIGS. 12A and 12B, by the metal supporting connecting portion removing step, the plurality of metal supporting terminals 50 are electrically insulated from the metal supporting frame portion 15, so that the electrical conduction of the plurality of external terminals 30 to each other can be interrupted.

As a result, the plurality of external terminals 30 can be formed as independent terminals.

In the fifth embodiment of the suspension board with circuit 1 and the method for producing the suspension board with circuit 1, the same function and effect as that of the above-described embodiment can be obtained.

In the fifth embodiment, the reinforcement metal supporting portions 21 at the inside of the board-side opening portion 19 can be also removed in the same manner as the above-described third embodiment.

<Sixth Embodiment>

In a sixth embodiment of the suspension board with circuit 1, as shown in FIGS. 13A and 13B, with respect to the above-described fifth embodiment, in the producing step thereof, the first connecting portion 22 and the second connecting portion 23 of the reinforcement portion 16 are alternately disposed in the longitudinal direction, and at least one of the one-side end portions and the other-side end portions in the widthwise direction of the metal supporting terminals 50 is continuous to the inner circumferential surface of the board-side opening portion 19.

To be specific, the first connecting portion 22 connects each of the one-side end portions in the widthwise direction of the second and the third reinforcement metal supporting portions 21 from the one side in the longitudinal direction, and connects the one-side end portion in the widthwise direction of the fourth reinforcement metal supporting portion 21 from the one side in the longitudinal direction to that of the most other-side reinforcement metal supporting portion 21 in the longitudinal direction. The other-side end portion in the longitudinal direction of the first connecting portion 22 that connects the one-side end portion in the widthwise direction of the most other-side reinforcement metal supporting portion 21 in the longitudinal direction extends toward the other side in the longitudinal direction with respect to the most other-side reinforcement metal supporting portion 21 in the longitudinal direction.

The second connecting portion 23 connects the other-side end portion in the widthwise direction of the most one-side reinforcement metal supporting portion 21 in the longitudinal direction to that of the second reinforcement metal supporting portion 21 from the one side in the longitudinal direction, and connects each of the other-side end portions in the widthwise direction of the third and the fourth reinforcement metal supporting portions 21 from the one side in the longitudinal direction.

Both end portions in the widthwise direction of the most one-side metal supporting terminal 50 in the longitudinal direction are continuous to the inner circumferential surface of the board-side opening portion 19. The one-side end portion in the widthwise direction of the second metal supporting terminal 50 from the one side in the longitudinal direction is continuous to the inner circumferential surface of the board-side opening portion 19. The other-side end portion in the widthwise direction of the third metal supporting terminal 50 from the one side in the longitudinal direction is continuous to the inner circumferential surface of the board-side opening portion 19. The one-side end portion in the widthwise direction of the fourth metal supporting terminal 50 from the one side in the longitudinal direction is continuous to the inner circumferential surface of the board-side opening portion 19. The other-side end portion in the widthwise direction of the fifth metal supporting terminal 50 from the one side in the longitudinal direction is continuous to the inner circumferential surface of the board-side opening portion 19. The other-side end portion in the widthwise direction of the most other-side metal supporting terminal 50 in the longitudinal direction is continuous to the inner circumferential surface of the board-side opening portion 19.

To obtain the suspension board with circuit 1, in the fourth step, as shown in FIG. 13A, the first connecting portion 22 and the second connecting portion 23 of the reinforcement portion 16 are alternately formed in the longitudinal direction. Also, the plurality of metal supporting terminals 50 are formed so that at least one of the one side and the other side in the widthwise direction thereof is continuous to the inner surface in the widthwise direction of the board-side opening portion 19.

Next, in the fifth step, the electric power supply portion 41 is brought into contact with at least one piece of metal supporting terminal 50 of the plurality of metal supporting terminals 50 at the inside of the board-side opening portion 19, so that an electric power is supplied to the head-side terminals 29 and the external terminals 30 via the metal supporting terminals 50 and the metal supporting frame portion 15.

Thereafter, the supporting board 10 is trimmed and a portion that is continuous to the inner circumferential surface of the board-side opening portion 19 in the metal supporting terminals 50 is removed (metal supporting connecting portion removing step).

In this manner, the plurality of metal supporting terminals 50 are, when projected in the up-down direction, disposed at the inside of the board-side opening portion 19 so as to be spaced apart from the inner circumferential surface of the board-side opening portion 19 and electrically insulated from the metal supporting frame portion 15.

In the sixth embodiment of the suspension board with circuit 1 and the method for producing the suspension board with circuit 1, the same function and effect as that of the above-described embodiment can be obtained.

In the sixth embodiment, the reinforcement metal supporting portions 21, the first connecting portion 22, and the second connecting portion 23 at the inside of the board-side opening portion 19 can be also removed in the same manner as the above-described third embodiment.

The first connecting portion 22 and the second connecting portion 23 do not have to be alternately formed in the longitudinal direction, as long as at least one of the one sides and the other sides in the widthwise direction of the metal supporting terminals 50 can be continuous to the inner surface in the widthwise direction of the board-side opening portion 19.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A method for producing a wired circuit board comprising:
   a first step of preparing a metal supporting layer;
   a second step of forming an insulating layer having a first opening and a plurality of terminal forming portions disposed at spaced intervals to each other at the inside of the first opening at one side of the metal supporting layer in a thickness direction, where the thickness direction is orthogonal to a longitudinal direction and a width direction of the wired circuit board;
   a third step of forming a conductor layer, which has a plurality of terminal portions corresponding to the respective plurality of terminal forming portions and an electrically conductive portion electrically connecting each of the plurality of terminal portions to the metal supporting layer, on one side of the insulating layer in the thickness direction that is opposite to the metal supporting layer;
   a fourth step of, by partially removing the metal supporting layer, forming a metal supporting frame portion having a second opening which opens into the first opening, when projected in the thickness direction, a metal supporting connecting portion electrically connected to the electrically conductive portion, and at least one reinforcement metal supporting portion, when projected in the thickness direction, disposed between the plurality of terminal forming portions at the inside of the second opening, traversing the first opening in a direction orthogonal to both directions of an arrangement direction having the plurality of terminal forming portions arranged in the thickness direction, and separated from the metal supporting frame portion; and
   a fifth step of forming a metal plating layer at surfaces of the plurality of terminal portions by electrolytic plating via the metal supporting connecting portion.

2. The method for producing a wired circuit board according to claim 1 further comprising:
   after the fourth step, a terminal forming portion removing step of removing the plurality of terminal forming portions exposed from the second opening and exposing both side surfaces in the thickness direction of the plurality of terminal portions.

3. The method for producing a wired circuit board according to claim 1, wherein in the second step, the insulating layer is formed so as to allow each of the plurality of terminal forming portions to include an insulating through hole passing through in the thickness direction;

in the third step, the conductor layer is formed so as to allow the plurality of terminal portions to fill the insulating through holes of the respective plurality of terminal forming portions; and in the fourth step, the metal supporting layer is partially removed so as to form a metal supporting terminal corresponding to each of the plurality of terminal forming portions.

4. The method for producing a wired circuit board according to claim 1 further comprising:

after the fifth step, a metal supporting connecting portion removing step of interrupting electrical conduction of the plurality of terminal portions by removing at least a part of the metal supporting connecting portion.

5. The method for producing a wired circuit board according to claim 1 further comprising:

after the fifth step, a reinforcement metal supporting portion removing step of partially removing the reinforcement metal supporting portion so as to leave a portion overlapped with the insulating layer, when projected in the thickness direction.

6. The method for producing a wired circuit board according to claim 1, wherein in the fourth step, the metal supporting layer is partially removed so as to form at least two of the at least one reinforcement metal supporting portion and a connecting portion overlapped with the insulating layer, when projected in the thickness direction, and connecting at least the two reinforcement metal supporting portions.

* * * * *